(12) United States Patent
Nakasugi et al.

(10) Patent No.: US 7,482,604 B2
(45) Date of Patent: Jan. 27, 2009

(54) ELECTRON BEAM LITHOGRAPHY APPARATUS, LITHOGRAPHY METHOD, LITHOGRAPHY PROGRAM, AND MANUFACTURING METHOD OF A SEMICONDUCTOR DEVICE

(75) Inventors: Tetsuro Nakasugi, Yokohama (JP); Noriaki Sasaki, Yokohama (JP); Takeshi Koshiba, Yokohama (JP); Takumi Ota, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 452 days.

(21) Appl. No.: 11/430,044

(22) Filed: May 9, 2006

(65) Prior Publication Data

US 2006/0289805 A1    Dec. 28, 2006

(30) Foreign Application Priority Data

May 10, 2005    (JP)    ............................. 2005-137422

(51) Int. Cl.
G21G 5/00    (2006.01)

(52) U.S. Cl. ............................. 250/492.22; 250/492.1; 250/492.2; 250/492.3; 250/493.1; 250/396 R; 430/30; 430/296; 438/463

(58) Field of Classification Search ............... 250/492.1, 250/492.2, 492.22, 492.23, 492.3, 493.1, 250/396 R; 430/30, 296; 438/401, 462, 438/463

See application file for complete search history.

(56) References Cited

U.S. PATENT DOCUMENTS

| | | | | |
|---|---|---|---|---|
| 5,329,130 A * | 7/1994 | Kai et al. | ............... | 250/492.22 |
| 5,610,406 A * | 3/1997 | Kai et al. | ............... | 250/492.22 |
| 5,849,436 A * | 12/1998 | Yamada et al. | ................. | 430/5 |
| 6,337,486 B2 | 1/2002 | Sasaki et al. | | |
| 6,346,354 B1 * | 2/2002 | Abe et al. | ...................... | 430/30 |
| 6,415,432 B1 * | 7/2002 | Saito et al. | .................... | 716/21 |
| 6,436,594 B2 | 8/2002 | Tokunaga | | |
| 6,703,629 B2 | 3/2004 | Nakasugi | | |
| 6,897,454 B2 | 5/2005 | Sasaki et al. | | |
| 6,978,436 B2 * | 12/2005 | Cote et al. | .................... | 716/19 |

(Continued)

FOREIGN PATENT DOCUMENTS

JP    2000-269126    9/2000

(Continued)

OTHER PUBLICATIONS

Nakasugi et al., "Electron Beam Drawing Apparatus, Deflection Amplifier, Deflection Control Device, Electron Beam Drawing Method, Method of Manufacturing Semiconductor Device, and Electron Beam Drawing Program", U.S. Serial No. 11/268,603, filed Nov. 8, 2005.

Primary Examiner—Jack I Berman
Assistant Examiner—Michael J Logie
(74) Attorney, Agent, or Firm—Finnegan, Henderson, Farabow, Garrett & Dunner, L.L.P.

(57) ABSTRACT

According to an aspect of the invention, there is provided an electron beam lithography apparatus including a first setting unit configured to set a drawing position on a semiconductor substrate based on layout information of the semiconductor substrate, a second setting unit configured to set a valid range on the semiconductor substrate based on shape information of the semiconductor substrate, a determination unit configured to determine whether or not the drawing position falls within the valid range, and an irradiation unit configured to irradiate the semiconductor substrate with an electron beam when the determination unit determines that the drawing position falls within the valid range.

20 Claims, 17 Drawing Sheets

U.S. PATENT DOCUMENTS

| | | |
|---|---|---|
| 2002/0141633 A1* | 10/2002 | Nakashima et al. ......... 382/144 |
| 2002/0196255 A1 | 12/2002 | Saito |
| 2003/0106999 A1* | 6/2003 | Komuro et al. ............. 250/307 |
| 2003/0190070 A1* | 10/2003 | Ando et al. ................. 382/145 |
| 2005/0088099 A1 | 4/2005 | Ota et al. |
| 2005/0153217 A1* | 7/2005 | Izuha et al. ................... 430/5 |
| 2005/0214958 A1* | 9/2005 | Nakasuji et al. ............... 438/14 |
| 2006/0017013 A1 | 1/2006 | Ota et al. |

FOREIGN PATENT DOCUMENTS

JP         2000277410 A   *  10/2000

* cited by examiner

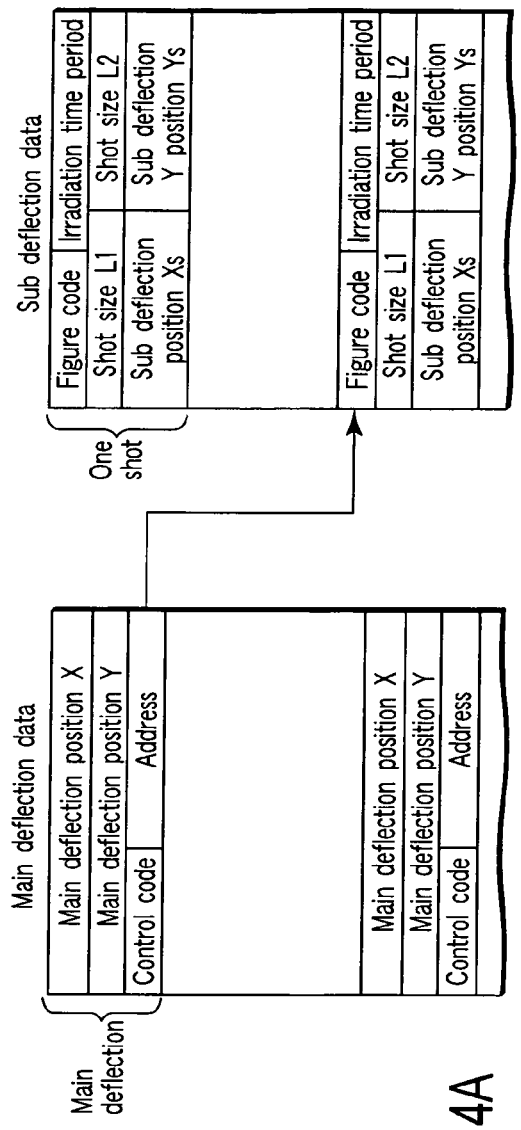
F I G. 4A
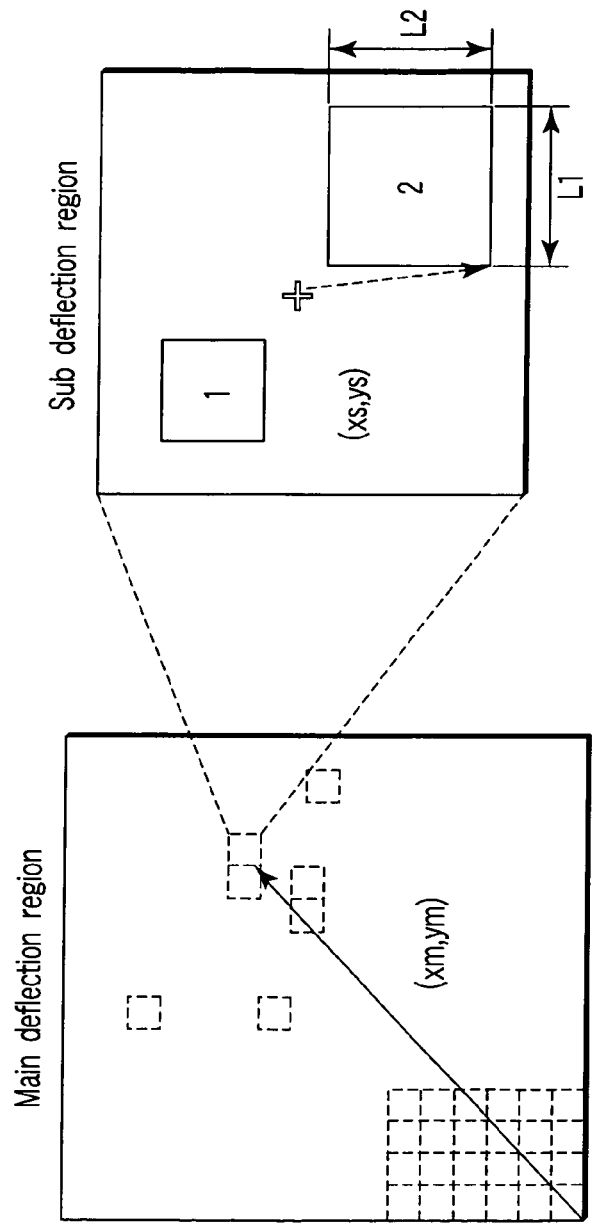
F I G. 4B

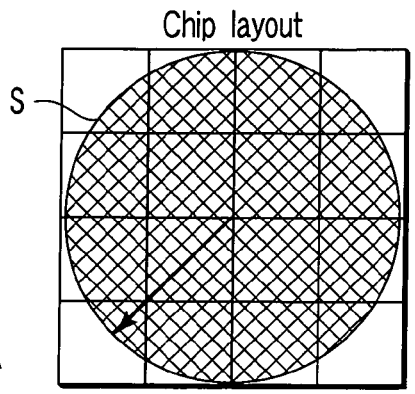
FIG. 5A
Chip layout
| Chip number (X, Y) | Xchip | Ychip |
|---|---|---|
| 1,1 | −75 | −75 |
| 2,1 | −25 | −75 |
| ⋮ | ⋮ | ⋮ |
| ⋮ | ⋮ | ⋮ |
| ⋮ | ⋮ | ⋮ |
| 4,4 | 75 | 75 |
FIG. 5B
[mm]
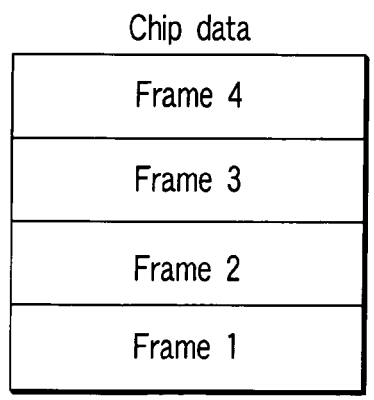
FIG. 6A
Chip data
| Frame number | Xf | Yf |
|---|---|---|
| 1 | −25 | −25 |
| 2 | −25 | −12.5 |
| 3 | −25 | 0 |
| 4 | −25 | 12.5 |
FIG. 6B
[mm]

| Stripe number | Xstr | Ystr |
|---|---|---|
| 1 | −100 | −100 |
| 2 | −100 | −87.5 |
| ⋮ | ⋮ | ⋮ |
| ⋮ | ⋮ | ⋮ |
| 16 | −100 | 87.5 |

| Procedure | Chip number (X, Y) | Frame number | Stripe number |
|---|---|---|---|
| 1 | 1,1 | 1 | 1 |
| 2 | 2,1 | 1 | 1 |
| 3 | 3,1 | 1 | 1 |
| 4 | 4,1 | 1 | 1 |
| 5 | 1,1 | 2 | 2 |
| 6 | 2,1 | 2 | 2 |
| ⋮ | ⋮ | ⋮ | ⋮ |
| ⋮ | ⋮ | ⋮ | ⋮ |

| Stripe number | Y | Xmin | Xman |
|---|---|---|---|
| 1 | -100 | -5 | 5 |
| 2 | -75 | -25 | 25 |
| ⋮ | ⋮ | ⋮ | ⋮ |
| ⋮ | ⋮ | ⋮ | ⋮ |
| 16 | 100 | -5 | 5 |

[mm]

ELECTRON BEAM LITHOGRAPHY APPARATUS, LITHOGRAPHY METHOD, LITHOGRAPHY PROGRAM, AND MANUFACTURING METHOD OF A SEMICONDUCTOR DEVICE

CROSS-REFERENCE TO RELATED APPLICATIONS

This application is based upon and claims the benefit of priority from prior Japanese Patent Application No. 2005-137422, filed May 10, 2005, the entire contents of which are incorporated herein by reference.

BACKGROUND OF THE INVENTION

1. Field of the Invention

The present invention relates to an electron beam lithography apparatus, lithography method, and lithography program for drawing a circuit pattern of a semiconductor integrated circuit and a manufacturing method of a semiconductor device.

2. Description of the Related Art

In the manufacture of semiconductor elements, CMP (Chemical Mechanical Polishing), etching, and the like are used. These processes result in different processing shapes depending on the presence/absence of a surrounding pattern.

On the other hand, each semiconductor chip generally has a rectangular shape, and a silicon wafer has a circular shape. For this reason, when chips are to be laid out on the entire surface of a wafer, deficient chips are formed near the periphery of the wafer. Since these deficient chips do not function as chips, it is wasteful to expose them on the wafer.

However, under the present situation, in order to suppress variations of the processing shapes upon CMP or etching described above, these deficient chips are also drawn. This deficient chip drawing causes the following two problems in electron beam lithography.

First, a waste in time required to draw deficient chips is a serious problem in electron beam lithography which originally has a low throughput. Second, upon drawing deficient chips, a stage which mounts the wafer is irradiated with an electron beam. As a result, contaminations are accumulated on the stage.

Note that Jpn. Pat. Appln. KOKAI Publication No. 2000-269126 discloses the following technique. That is, upon drawing an invalid chip region as a region which suffers deficiency or insufficient chips to be drawn near the periphery of the wafer, a plurality of dummy patterns are exposed to have the same area density as a valid chip area, and a rectangle of a maximum shot size is set by a variable shaped electron beam.

BRIEF SUMMARY OF THE INVENTION

According to an aspect of the invention, there is provided an electron beam lithography apparatus comprising: a first setting unit configured to set a drawing position on a semiconductor substrate based on layout information of the semiconductor substrate; a second setting unit configured to set a valid range on the semiconductor substrate based on shape information of the semiconductor substrate; a determination unit configured to determine whether or not the drawing position falls within the valid range; and an irradiation unit configured to irradiate the semiconductor substrate with an electron beam when the determination unit determines that the drawing position falls within the valid range.

According to another aspect of the invention, there is provided an electron beam lithography method comprising: setting a drawing position on a semiconductor substrate based on layout information of the semiconductor substrate; setting a valid range on the semiconductor substrate based on shape information of the semiconductor substrate; determining whether or not the drawing position falls within the valid range; and irradiating the semiconductor substrate with an electron beam when it is determined that the drawing position falls within the valid range.

According to another aspect of the invention, there is provided an electron beam lithography program which is stored in a storage medium readable by a computer, the program making the computer: set a drawing position on a semiconductor substrate based on layout information of the semiconductor substrate; set a valid range on the semiconductor substrate based on shape information of the semiconductor substrate; determine whether or not the drawing position falls within the valid range; and irradiate the semiconductor substrate with an electron beam when it is determined that the drawing position falls within the valid range.

According to another aspect of the invention, there is provided a manufacturing method of a semiconductor device which manufactures a semiconductor device by use of a semiconductor substrate on which a lithography process is performed, the lithography process comprising: setting a drawing position on a semiconductor substrate based on layout information of the semiconductor substrate; setting a valid range on the semiconductor substrate based on shape information of the semiconductor substrate; determining whether or not the drawing position falls within the valid range; and irradiating the semiconductor substrate with an electron beam when it is determined that the drawing position falls within the valid range.

BRIEF DESCRIPTION OF THE SEVERAL VIEWS OF THE DRAWING

FIGS. 4A and 4B show the structure of drawing data according to the first embodiment;

FIGS. 5A and 5B are views for explaining details of wafer layout data according to the first embodiment;

FIGS. 6A and 6B are views for explaining details of wafer layout data according to the first embodiment;

DETAILED DESCRIPTION OF THE INVENTION

Embodiments of the present invention will be described hereinafter with reference to the accompanying drawings.

An electron beam lithography apparatus used in the first embodiment of the invention uses a continuous stage movement system and a main-sub 2-step deflection system.

Figure 1:
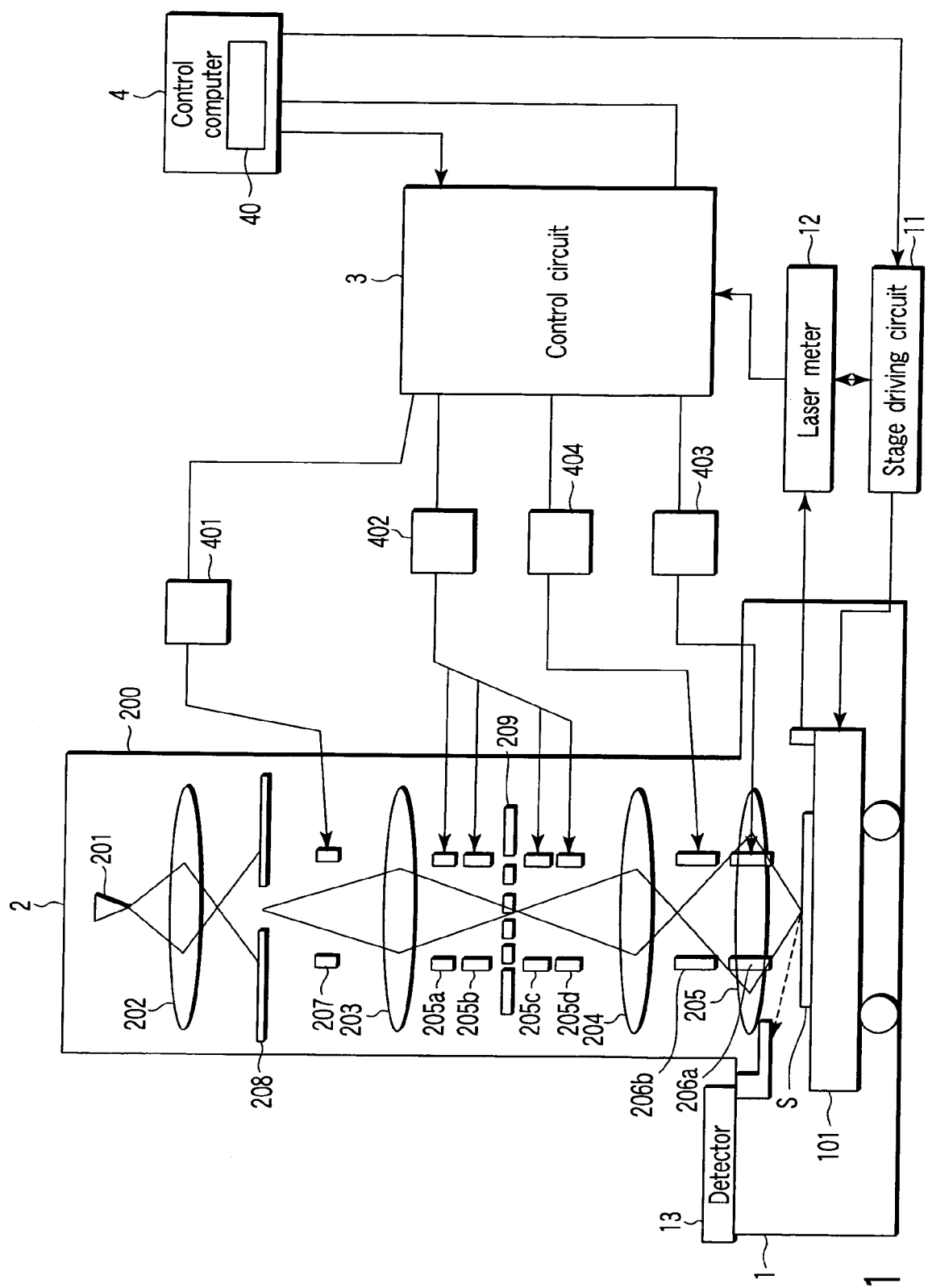
FIG. 1 is a schematic view of an electron beam lithography apparatus according to a first embodiment.

FIG. 1 is a schematic view of an electron beam lithography apparatus according to the first embodiment. A sample chamber 1 houses an X-Y stage 101 which mounts a wafer (sample, semiconductor substrate) S. This stage 101 is driven by a stage driving circuit 11, and the moving position of the stage 101 is measured by a laser meter 12. Secondary electrons and reflected electrons from the wafer S are detected by an electron detector 13.

An electron optical system 2 is arranged in a lens barrel 200 above the sample chamber 1. The electron optical system 2 includes an electron gun 201, various lenses (condenser lens 202, projection lens 203, reducing lens 204, and objective lens 205), various deflectors (CP deflectors 205a to 205d, main deflector 206a, sub deflector 206b, and blanking deflector 207), a beam shaping aperture 208, and a CP aperture 209. In FIG. 1, a beam adjustment electrode, coil, and the like which are equipped in the conventional electron beam lithography apparatus are not shown.

A control circuit 3 controls, via a blanking amplifier 401, the blanking deflector 207, which turns on and off a beam. The control circuit 3 controls, via a beam shaping amplifier 402, the CP deflectors 205a to 205d, which shape a beam. Furthermore, the control circuit 3 controls the main deflector 206a via a main deflection amplifier 403, and the sub deflector 206b via a sub deflection amplifier 404. With this control, a beam is scanned on the wafer S. Note that an acceleration voltage is 5 keV, and the sizes of the deflection regions of the main deflector 206a and the sub deflector 206b are respectively 1.5 mm and 50 μm.

Figure 2:
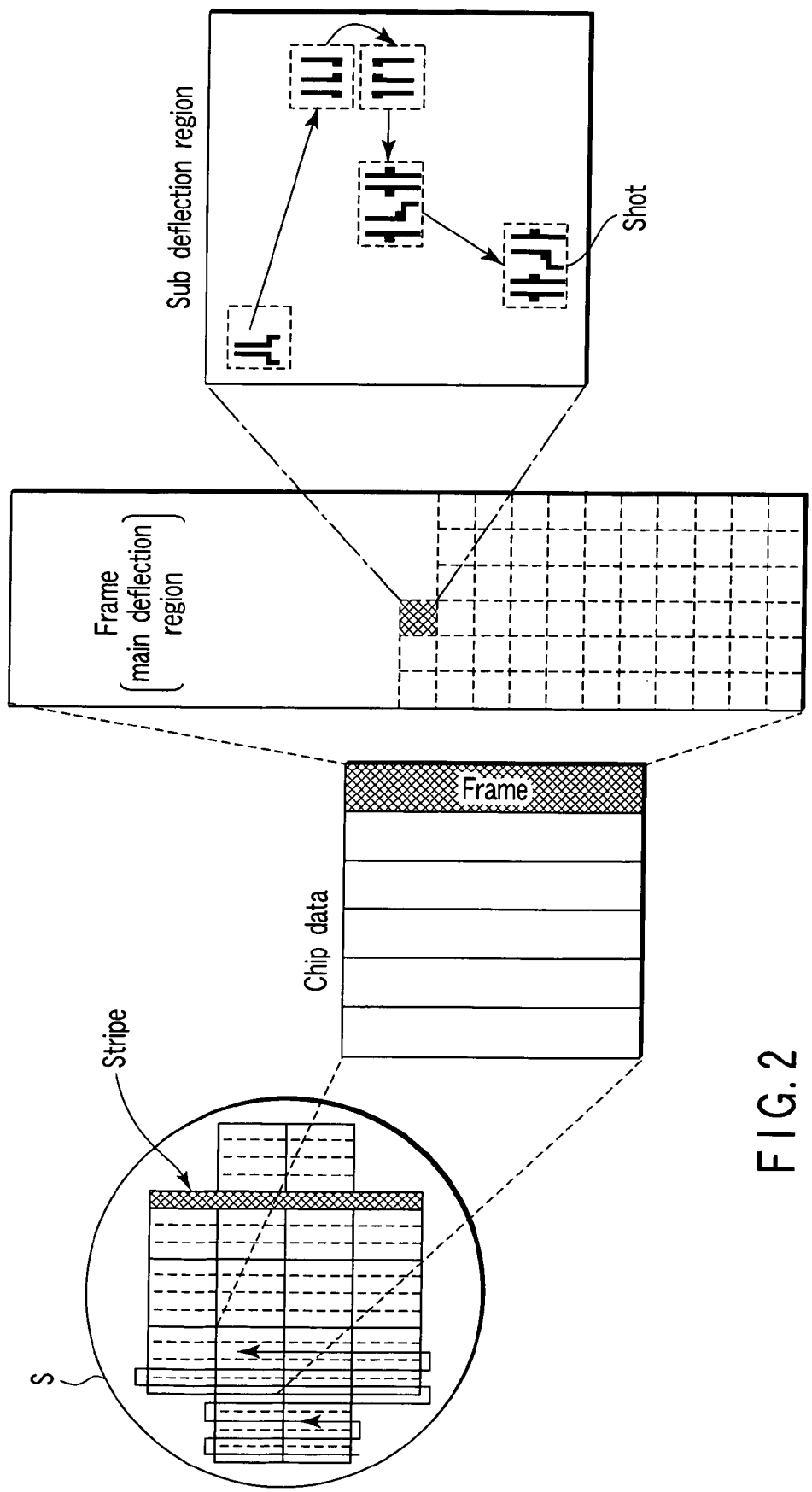
FIG. 2 is a view for explaining a lithography method according to the first embodiment.
Figures 7A, 7B, 8:
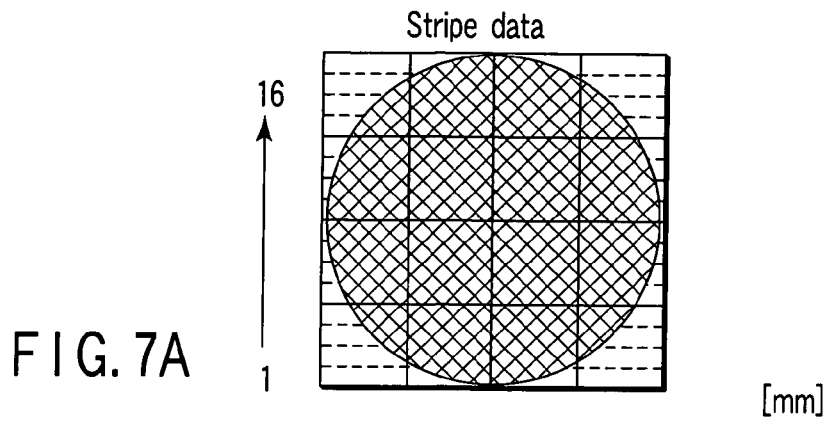
FIGS. 7A and 7B are views for explaining details of wafer layout data according to the first embodiment.
FIG. 8 is a view for explaining details of wafer layout data according to the first embodiment.

FIG. 2 is a view for explaining a lithography method according to the first embodiment. The continuous stage movement system used in the first embodiment is a system in which a plurality of chips on the wafer S are divided into stripe-shaped main deflection regions called stripes, and patterns are drawn while continuously driving the stage 101, as shown in FIG. 2. This system can expect a high throughput since the number of times of step movement of the stage 101 is small. Note that the stripes are divided in the vertical direction in FIG. 2, but they may be divided in the horizontal direction. FIG. 7A and subsequent figures show an example in which stripes are divided in the horizontal direction.

The main-sub 2-step deflection system is a system in which the main deflector 206a aligns the sub deflection region within the range as broad as several mm, and the sub deflector 206b aligns a shot within a range of several ten μm at high speed, thus drawing a drawing range at high speed. In this system, chip data (drawing data) is divided into stripe-shaped main deflection regions called frames. The sub deflection region position in the main deflection region is aligned by the main deflector 206a, and the shot position in the sub deflection region is aligned by the sub deflector 206b.

These series of control operations are executed by a control program stored in a storage device (storage medium) 40 in a control computer (computer) 4 shown in FIG. 1. This control program controls respective units such as the control circuit 3 to operate in accordance with EB drawing data and layout data, thus executing drawing.

Figure 3:
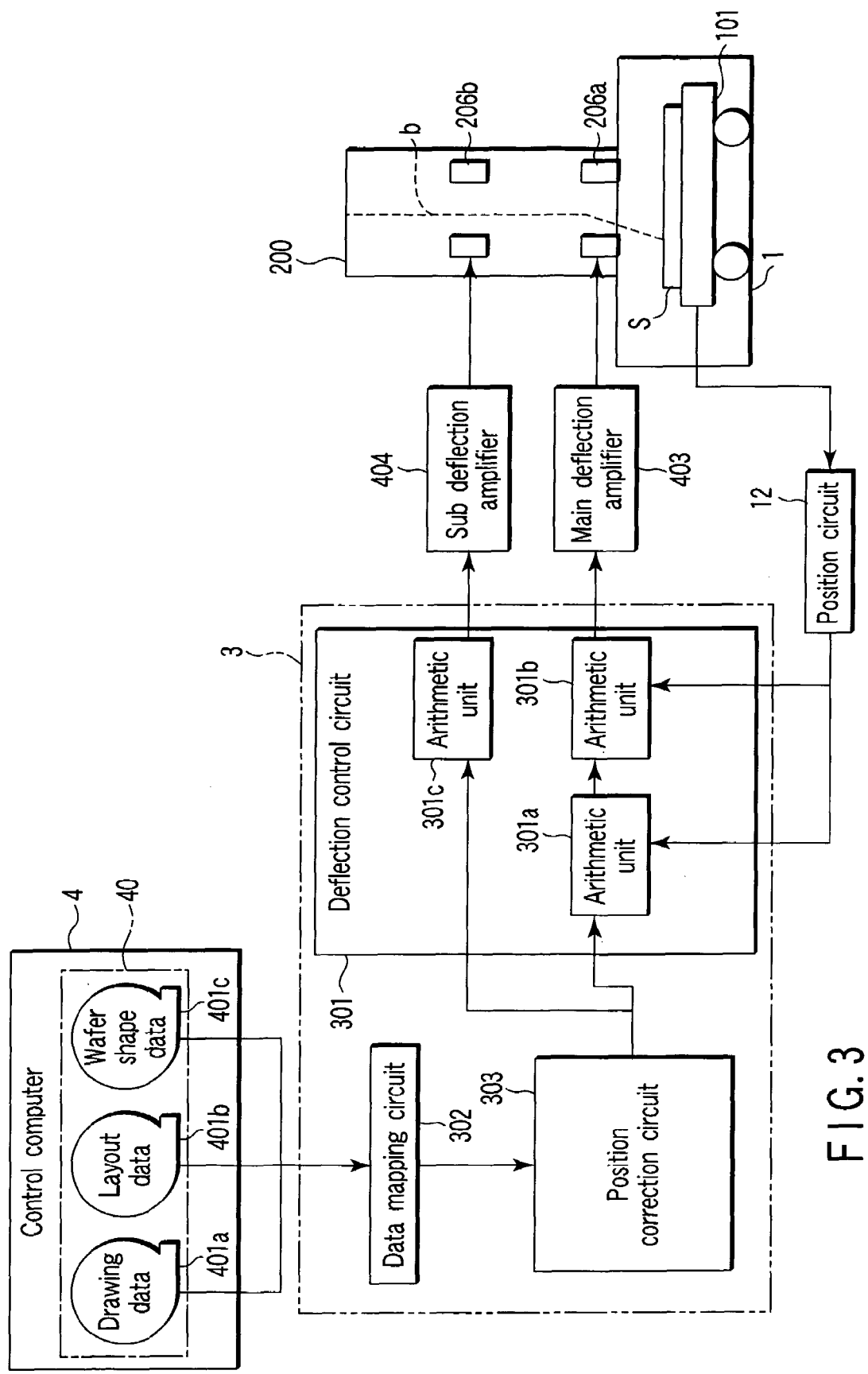
FIG. 3 is a schematic view of the electron beam lithography apparatus according to the first embodiment.

FIG. 3 is a schematic view of the electron beam lithography apparatus according to the first embodiment. The functions of respective units will be described below based on FIG. 3. The same reference numerals in FIG. 3 denote the same parts as in FIG. 1. Also, a description of sequence items done in the conventional electron beam lithography apparatus such as a parameter transfer sequence to a deflection control circuit 301 and the like will be omitted.

The storage device 40 in the control computer 4 stores drawing data 401a, wafer layout data 401b, and wafer shape data 401c. The control circuit 3 comprises a deflection control circuit 301, data mapping circuit 302, and position correction circuit 303. The deflection control circuit 301 comprises arithmetic units 301a, 301b, and 301c.

The control computer 4 writes the drawing data 401a, wafer layout data 401b (including procedure data, chip position data, frame position data, and stripe position data), and wafer shape data 401c in the data mapping circuit 302.

FIGS. 4A and 4B show the structure of the drawing data 401a. FIG. 4A shows the data format of the drawing data 401a, and FIG. 4B is a view for explaining respective data in FIG. 4A.

As shown in FIG. 4A, the drawing data 401a includes main deflection data required to control the main deflector 206a, and sub deflection data (shot data) required to control the sub deflector 206b. The main deflection data describes the positions (Xm, Ym) of sub deflection regions in the main deflection region, addresses indicating the data start positions of shots included in each sub deflection region, and control codes including the number of shots in each sub deflection region. The position (Xm, Ym) of each sub deflection region in the main deflection region is described as that of the center of each sub deflection region from a frame origin, and indicates the drawing position of each sub deflection region on a frame coordinate system (from the frame origin). The sub deflection data is written with the positions (Xs, Ys) of shots in the sub deflection region, CP aperture positions required to control the CP deflectors 205a to 205d, irradiation times, shot sizes, and the like. Note that the shot position (Xs, Ys) is described as a shot lower left position to have the center of the sub deflection region as an origin. Each CP aperture position is an aperture position from a CP aperture origin. Each shot size is described as the width and height when the shot lower left position is defined as an origin.

FIGS. 5A to 8 are views for explaining details of the wafer layout data 401b. The wafer layout data 401b includes chip position data, frame position data, stripe position data, and procedure data, as described above. In this apparatus, the sizes of the deflection regions of the main deflector 206a and sub deflector 206b are respectively 1.5 mm and 50 μm, as described above. However, in FIGS. 5A to 7, FIG. 9, FIG. 20, and FIG. 21, the wafer size is 200 mm (diameter), the chip size is 25 mm², and the frame width is 6.25 mm for the sake of descriptive convenience.

FIG. 5A shows a chip layout, and FIG. 5B shows chip position data. The chip position data gives chip numbers (X, Y) and describes respective chip positions (Xchip, Ychip) on a wafer coordinate system (the wafer center is an origin), as shown in FIG. 5B, in correspondence with respective chips laid out on the wafer S shown in FIG. 5A.

FIG. 6A shows chip data, and FIG. 6B shows frame position data generated based on the chip data. The frame position data describes frame origin positions (Xf, Yf) corresponding to frame numbers on a chip coordinate system (the chip center is an origin), as shown in FIG. 6B, in correspondence with respective frames of the chip data shown in FIG. 6A.

FIG. 7A shows a stripe layout, and FIG. 7B shows stripe position data generated based on the chip layout data and frame position data. The drawing region on the wafer S is divided into stripes, as shown in FIG. 7A, and the stripe position data describes stripe origin positions (Xstr, Ystr) corresponding to respective stripe numbers, as shown in FIG. 7B. In this case, by adding the origin position of each frame shown in FIG. 6B to each chip origin position shown in FIG. 5B, the stripe origin position (Xstr, Ystr) shown in FIG. 7B can be calculated.

FIG. 8 shows procedure data. As shown in FIG. 8, the procedure data describes chip numbers, frame numbers, and stripe numbers.

Figures 9, 10:
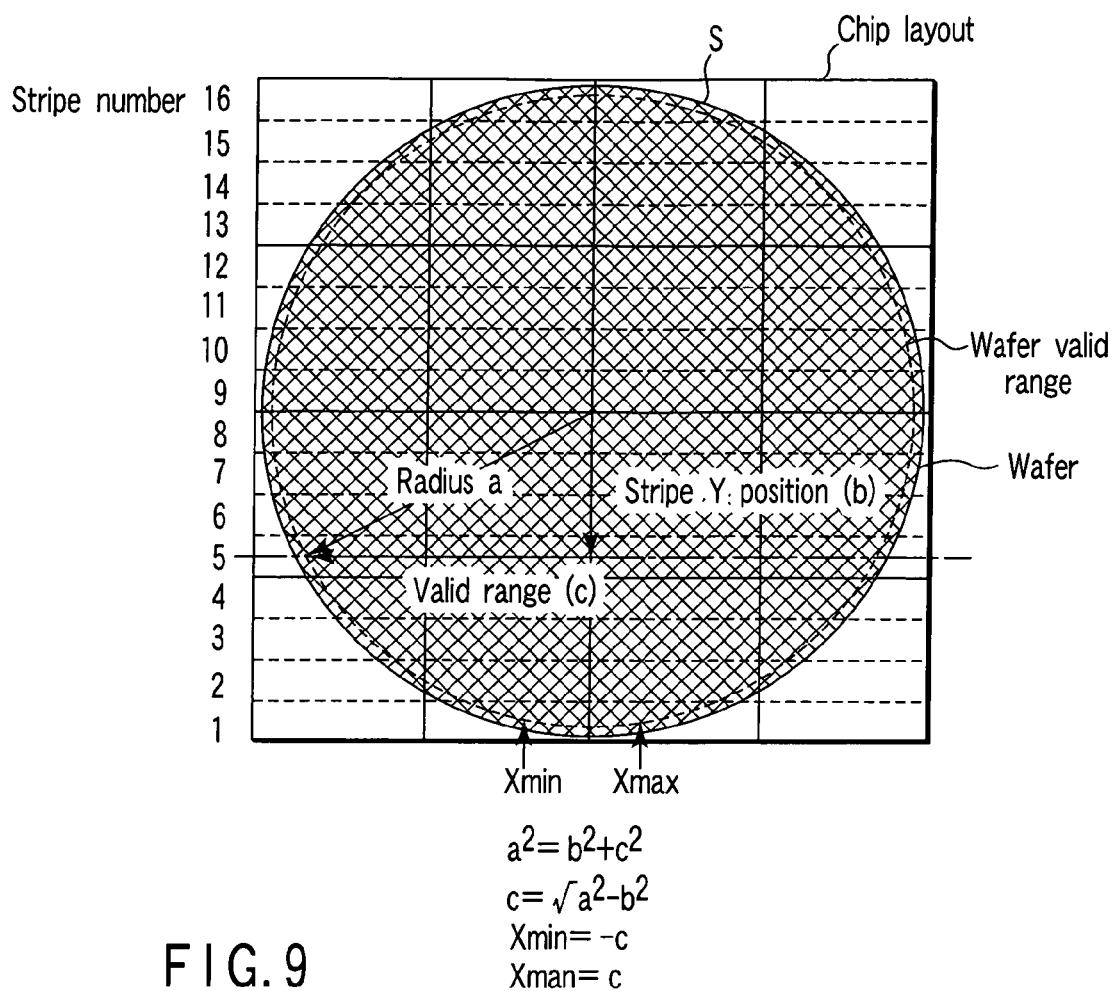
FIG. 9 is a view for explaining generation of wafer shape data according to the first embodiment.
FIG. 10 shows wafer shape data according to the first embodiment.

FIG. 9 is a view for explaining generation of the wafer shape data 401c, and FIG. 10 shows the wafer shape data. In order to generate the wafer shape data, Y (X axis direction) positions (one-dashed chain lines) are set for respective stripes on the chip layout on the wafer S. In FIG. 9, this Y position is set at the center (b in FIG. 9) of each stripe in the Y direction. Next, intersections (Xmin, Xmax, c in FIG. 9) between a wafer valid range (dotted line, a in FIG. 9) and the Y positions of the respective stripes are calculated. Note that the operator designates the wafer valid range (broken line, a in FIG. 9), and inputs it to the control computer. For example, when the wafer size is 200 mm (diameter), the operator inputs the wafer valid range (broken line, a in FIG. 9) as a range of a radius of 95 mm. As the setting of the valid range, a range of a diameter of 190 mm may be input. In this way, the Y positions (b in FIG. 9) and valid ranges Xmin and Xmax (c in FIG. 9) are calculated for all the stripes, and the wafer shape data shown in FIG. 10 is generated.

In this embodiment, the control computer 4 generates the wafer shape data 401c based on the wafer layout data 401b (including procedure data, chip position data, frame position data, and stripe position data) and the wafer valid range (broken line, a in FIG. 9) designated by the operator, and writes the generated data in the data mapping circuit 302.

Figure 11:
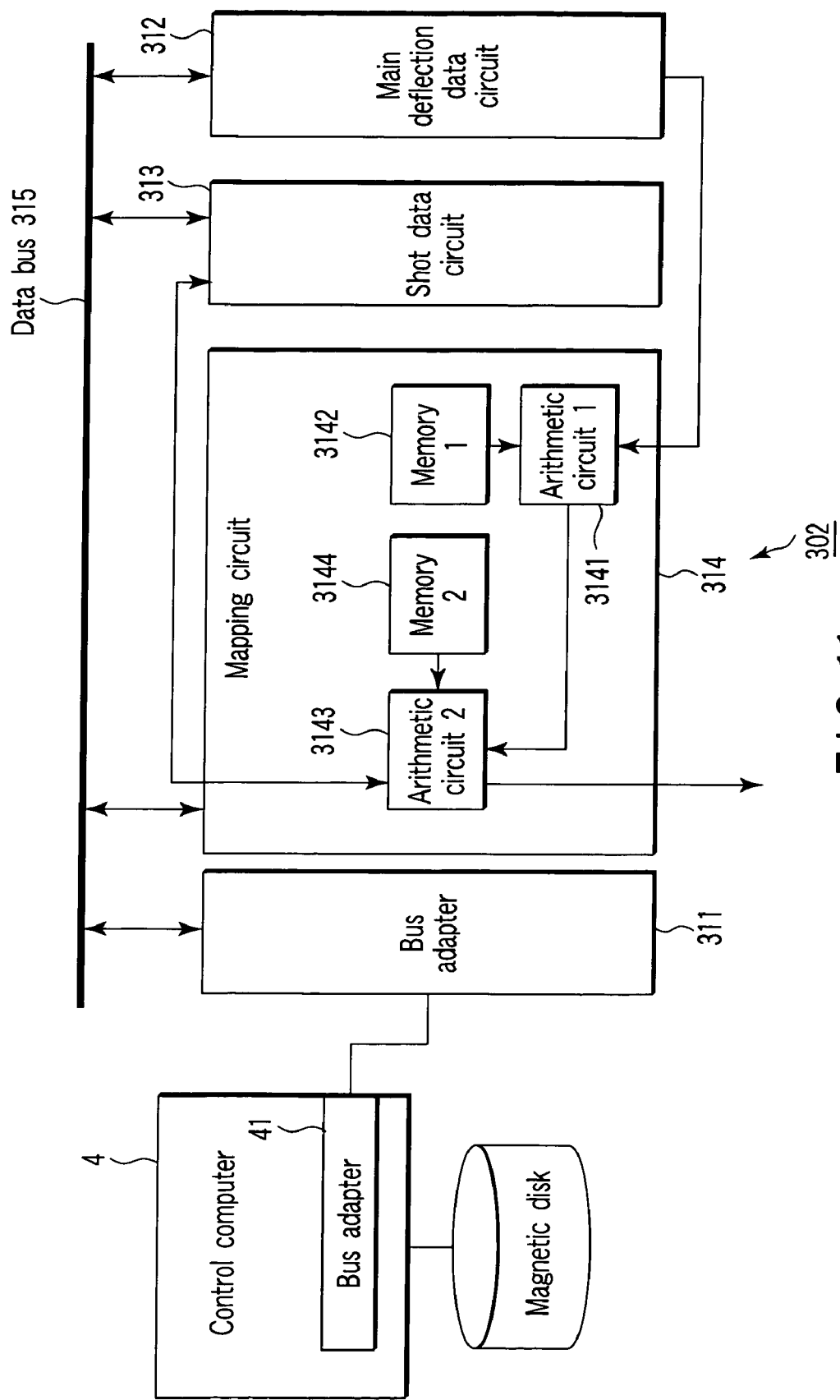
FIG. 11 is a block diagram showing the arrangement of a data mapping circuit according to the first embodiment.

FIG. 11 is a block diagram showing the arrangement of the data mapping circuit 302 according to the first embodiment. The data mapping circuit 302 comprises a bus adapter 311, main deflection data circuit 312, shot data circuit 313, and mapping circuit 314, which are connected to a data bus 315. The control computer 4 writes the chip data in the data mapping circuit 302 via a bus adapter 41. Main deflection data is stored in a memory in the main deflection data circuit 312, and shot data is stored in a memory in the shot data circuit 313.

The procedure data shown in FIG. 8 is stored in a first memory 3142 connected to a first arithmetic circuit 3141 in the mapping circuit 314. The chip position data shown in FIG. 5B, the frame position data shown in FIG. 6B, and the stripe position data shown in FIG. 7B are stored in a second memory 3144 connected to a second arithmetic circuit 3143 in the mapping circuit 314. The wafer shape data shown in FIG. 10 is stored in the second memory 3144 in the mapping circuit 314.

In FIG. 3, after the wafer S is placed on the stage 101 and a drawing preparation is completed, the control computer 4 issues a data output instruction to the data mapping circuit 302. The drawing preparation means a state in which a moving start point and end point of the stage 101 are calculated, and the stage 101 is located at the moving start point. The moving start point and end point of the stage 101 are calculated from a drawing start point and end point (Xstart, Xend) of each stripe. A runup distance and deceleration distance (X runup, X deceleration) are determined based on the drawing start point and end point (Xstart, Xend) of each stripe in correspondence with the stage speed of each stripe. That is, a stage moving start point and end point (Xstgs, Xstge) are determined as follows:

In case of forward movement, stage moving start point (Xstgs)=drawing start point (Xstart)−runup distance (X runup)

stage moving end point (Xstge)=drawing end point (Xend)+deceleration distance (X deceleration)

In case of reverse movement, stage moving start point (Xstgs)=drawing start point (Xstart)+runup distance (X runup)

stage moving end point (Xstge)=drawing end point (Xend)−deceleration distance (X deceleration)

More specifically, when the transfer start address, the number of words, and the number of transfer repetition times are instructed to the main deflection data circuit 312 shown in FIG. 11, transfer of the main deflection data starts from the memory in the main deflection data circuit 312 to the first arithmetic circuit 3141 in the mapping circuit 314. The main deflection data circuit 312 determines to output data or pause data transfer by detecting a half-full (HF) flag of a FIFO in the mapping circuit 314.

After the data output instruction is issued to the data mapping circuit 302, the control computer 4 issues a moving instruction to the stage 101. The control computer 4 moves the stage 101 to the stage moving start point via the stage driving circuit 11, and designates the moving end position and speed.

The first arithmetic circuit 3141 in the mapping circuit 314 receives the main deflection data from the main deflection data circuit 312 by its FIFO, and loads one set of main deflection data from the FIFO. Then, the circuit 3141 appends chip numbers, frame numbers, and stripe numbers to the main deflection data received from the main deflection data circuit 312 in accordance with the procedure data stored in the first memory 3142. The last sub deflection position data of each frame is appended with a control code indicating the end of the frame, and the first arithmetic circuit 3141 detects this control code to advance the procedure of the procedure data by one. Furthermore, the first arithmetic circuit 3141 gives a control code indicating the end of a stripe to the last sub deflection position data of that stripe in accordance with the procedure data. After the first arithmetic circuit 3141 gives this control code, it advances the procedure of the procedure data by one, and returns to an instruction waiting state from the control computer 4.

The second arithmetic circuit 3143 converts the main deflection data including the chip numbers and frame numbers sent from the first arithmetic circuit 3141 into the wafer coordinate system to check whether or not the data fall within the valid range.

First, the second arithmetic circuit 3143 calls out chip position data stored in the second memory 3144 based on the chip number and reads out a chip position (Xchip, Ychip) described using the wafer coordinate system (the wafer center is an origin).

Next, the second arithmetic circuit 3143 calls out frame position data stored in the second memory 3144 based on the frame number, and reads out a frame origin position (Xf, Yf) described using the chip coordinate system (the chip center is an origin).

Then, the second arithmetic circuit 3143 adds the chip position (Xchip, Ychip), frame position (Xf, Yf), and main deflection position (Xm, Ym) to calculate a main deflection position (Xmwf, Ymwf) on the wafer coordinate system.

$$Xmwf=Xm+Xf+Xchip$$

$$Ymwf=Ym+Yf+Ychip$$

Note that the main deflection position (Xmwf, Ymwf) indicates the drawing position of each sub deflection region on the wafer coordinate system (from the wafer origin).

The second arithmetic circuit 3143 determines if data is valid with respect to the main deflection position (Xmwf, Ymwf). The second arithmetic circuit 3143 calls out the wafer shape data shown in FIG. 10 from the second memory 3144, calls out the wafer valid range (Xmin, Xmax) from the second memory 3144 based on the main deflection position Ymwf, and compares the main deflection position Xmwf with the wafer valid range (Xmin, Xmax).

In this comparison, if the main deflection position Xmwf falls within the valid range which is defined by:

wafer valid range Xmin<main deflection position
Xmwf<wafer valid range Xmax the second arithmetic circuit 3143 calls out shot data from the shot data circuit 313; otherwise, it discards the data and loads the next main deflection data from the FIFO.

If the second arithmetic circuit 3143 determines that the main deflection position Xmwf falls within the valid range, it reads out shot data from the shot data circuit 313. More specifically, the second arithmetic circuit 3143 activates the shot data circuit 313 by designating the start address of shot data and the number of shots included in the main deflection data shown in FIG. 4A. The shot data circuit 313 outputs shot data described at the address designated from the second arithmetic circuit 3143 as many as the designated number of shots to the second arithmetic circuit 3143. The second arithmetic circuit 3143 appends the shot data sent from the shot data circuit 313 to the main deflection data, and outputs that data to the subsequent position correction circuit 303 in a format shown in FIG. 12.

Figure 12:
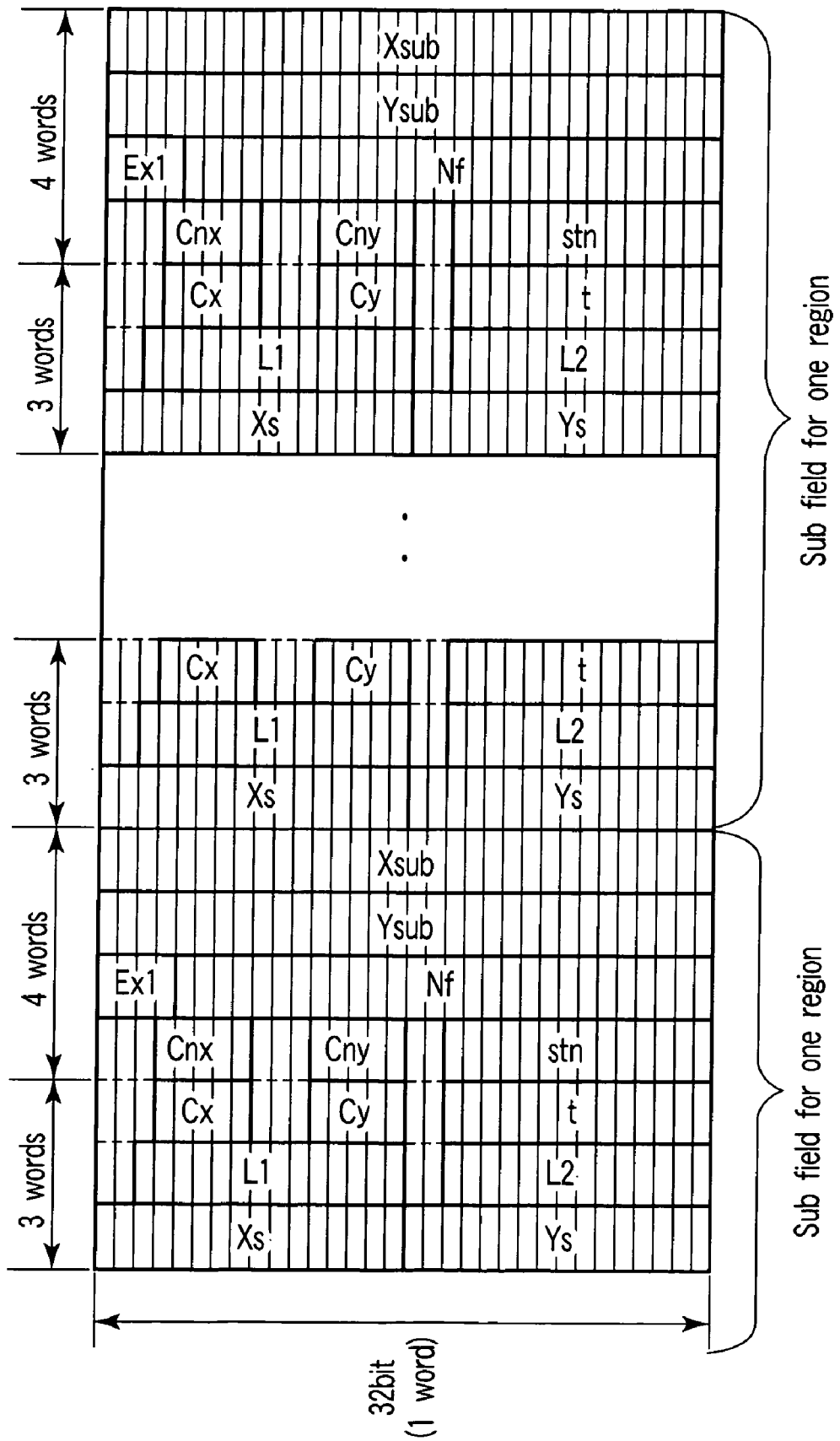
FIG. 12 shows output data from the data mapping circuit according to the first embodiment.

FIG. 12 shows output data from the data mapping circuit 302. Referring to FIG. 12, Xsub indicates a SUB_X position (32 bits); Ysub, a SUB_Y position (32 bits); Nf, a FIG read count designation (28 bits); Cnx, a chip X position (5 bits); Cny, a chip Y position (5 bits); stn, a stripe number (10 bits); Cx, a CP_X position (5 bits); Cy, a CP_Y position (5 bits); t, an irradiation time period (14 bits); L1, a shot size (14 bits); L2, a shot size (14 bits); Xs, a shot position (16 bits); and Ys, a shot position (16 bits).

The position correction circuit 303 divides the received data into the main scan data and shot data. Furthermore, the position correction circuit 303 applies position correction of a wafer distortion and chip distortion to the main deflection data, converts the main deflection data from the wafer coordinate system into the stage coordinate system, and outputs the converted data to the subsequent deflection control circuit 301. The position correction circuit 303 outputs the shot data to the arithmetic unit 301c in the deflection control circuit 301.

The deflection control circuit 301 processes the received main deflection data and shot data. The arithmetic unit 301a determines based on the output (current stage coordinates (Xstg, Ystg), wafer height) from the position circuit 12 whether or not the main deflection data converted into the stage coordinate system falls within the drawing range. If the main deflection data falls within the drawing range, the arithmetic unit 301a determines the main deflection position, and applies position correction due to a lens distortion. Furthermore, the main deflection data is output to the main deflection amplifier 403 via the arithmetic unit 301b, thus controlling the main deflector 206a to generate a desired voltage.

The arithmetic unit 301b always measures the output from the position circuit 12, and corrects the output from the main deflection amplifier 403 so that the electron beam position traces the stage position. The shot data undergoes a position correction arithmetic operation by the arithmetic unit 301c, and is then output to the sub deflection amplifier 404, thus controlling the sub deflector 206b to generate a desired voltage.

When the main deflector 206a and the sub deflector 206b have reached the desired voltages, a blanking signal generation circuit (not shown) releases a blanking signal, and the wafer S is irradiated with an electron beam b.

In the description of the above embodiment, the control computer 4 generates the wafer shape data 401c based on the wafer layout data 401b (including procedure data, chip position data, frame position data, and stripe position data) and the wafer valid range (broken line, a in FIG. 9), and writes it in the data mapping circuit 302. However, another method may be used. For example, the control computer 4 may write the wafer valid range in the data mapping circuit 302, which may generate the wafer shape data shown in FIG. 10 in advance.

According to the first embodiment of the invention, since it is determined based on the wafer shape information if each deficient chip part is located on the wafer, and beam irradiation is done based on the determination result, the chip yield can be improved. Also, no contaminations are generated on the stage. Furthermore, no drawing data is prepared for deficient chip drawing, and the wasteful time can be reduced. Therefore, the productivity in electron beam exposure can be greatly improved.

In the first embodiment, the second arithmetic circuit 3143 determines if data is valid with respect to the main deflection position (Xmwf, Ymwf). If the main deflection position Xmwf falls within the valid range, the second arithmetic circuit 3143 calls out shot data from the shot data circuit 313, and outputs it to the subsequent position correction circuit 303 in the format shown in FIG. 12. However, another method may be used. In the second embodiment, a method of appending a beam on-off flag to data to be output to the subsequent position correction circuit 303 will be described.

In the second embodiment, the second arithmetic circuit 3143 determines if data is valid with respect to the main deflection position (Xmwf, Ymwf). The second arithmetic circuit 3143 calls out the wafer shape data shown in FIG. 10 from the second memory 3144, calls out the wafer valid range (Xmin, Xmax) from the second memory 3144 based on the main deflection position Ymwf, and compares the main deflection position Xmwf with the wafer valid range (Xmin, Xmax).

In this comparison, if the main deflection position Xmwf falls within the valid range which is defined by:

wafer valid range Xmin<main deflection position Xmwf<wafer valid range Xmax the second arithmetic circuit 3143 calls out shot data from the shot data circuit 313. More specifically, the second arithmetic circuit 3143 activates the shot data circuit 313 by designating the start address of shot data and the number of shots included in the main deflection data shown in FIG. 4A. The shot data circuit 313 outputs shot data described at the address designated from the second arithmetic circuit 3143 as many as the designated number of shots. The second arithmetic circuit 3143 appends the shot data sent from the shot data circuit 313 to the main deflection data, and outputs that data to the subsequent position correction circuit 303 in the format shown in FIG. 12.

Figure 13:
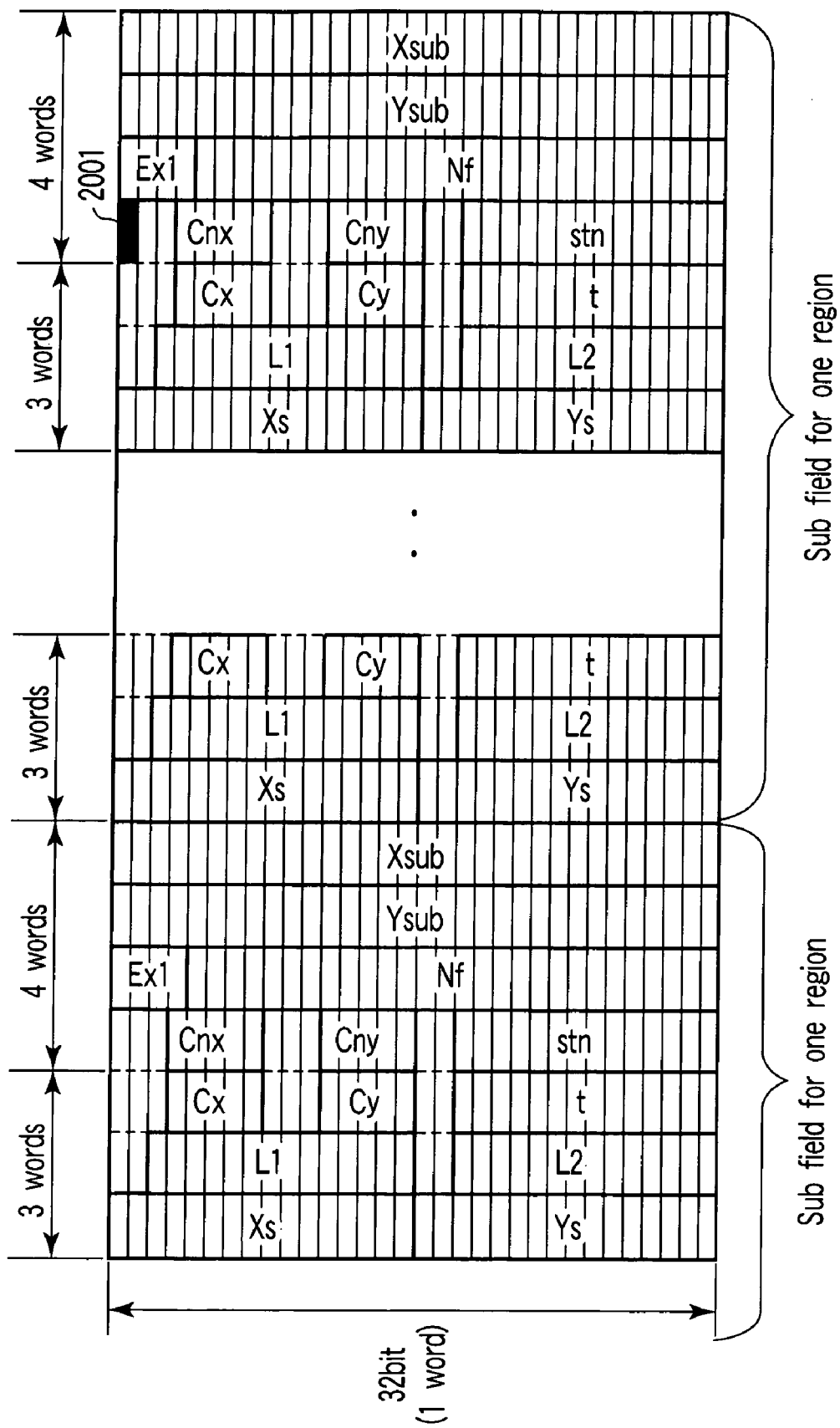
FIG. 13 is a view for explaining the output data format of the data mapping circuit according to a second embodiment.

On the other hand, if the main deflection position Xmwf falls outside the valid range as a result of comparison with the wafer valid range (Xmin, Xmax), a control flag that instructs to turn off a beam is appended to the data to be output to the subsequent position correction circuit 303. More specifically, as shown in FIG. 13, a control flag (2001) that instructs to turn off a beam is appended to the data to be output to the subsequent position correction circuit 303. The deflection control circuit 301 performs beam on-off control of the shot data in the sub deflection region output from the position correction circuit 303 based on this control flag that instructs to turn off a beam. That is, if the control flag (2001) is "1", the deflection control circuit 301 controls to turn off a beam for the corresponding shot data in the sub deflection region.

According to the second embodiment, since it is determined based on the wafer shape information if each deficient chip part is located on the wafer, and beam irradiation is done based on the determination result, the chip yield can be improved. Also, no contaminations are generated. Furthermore, no drawing data is prepared for deficient chip drawing, and the wasteful time can be reduced. Therefore, the productivity in electron beam exposure can be greatly improved.

In the third embodiment, the position control circuit determines the valid range in place of the data mapping circuit unlike in the first and second embodiments.

The schematic views of the electron beam lithography apparatus according to the third embodiment are the same as those shown in FIGS. 1 and 3 in the first embodiment. A description redundant to the first embodiment in that of the electron beam lithography apparatus according to the third embodiment will be omitted.

Figure 14:
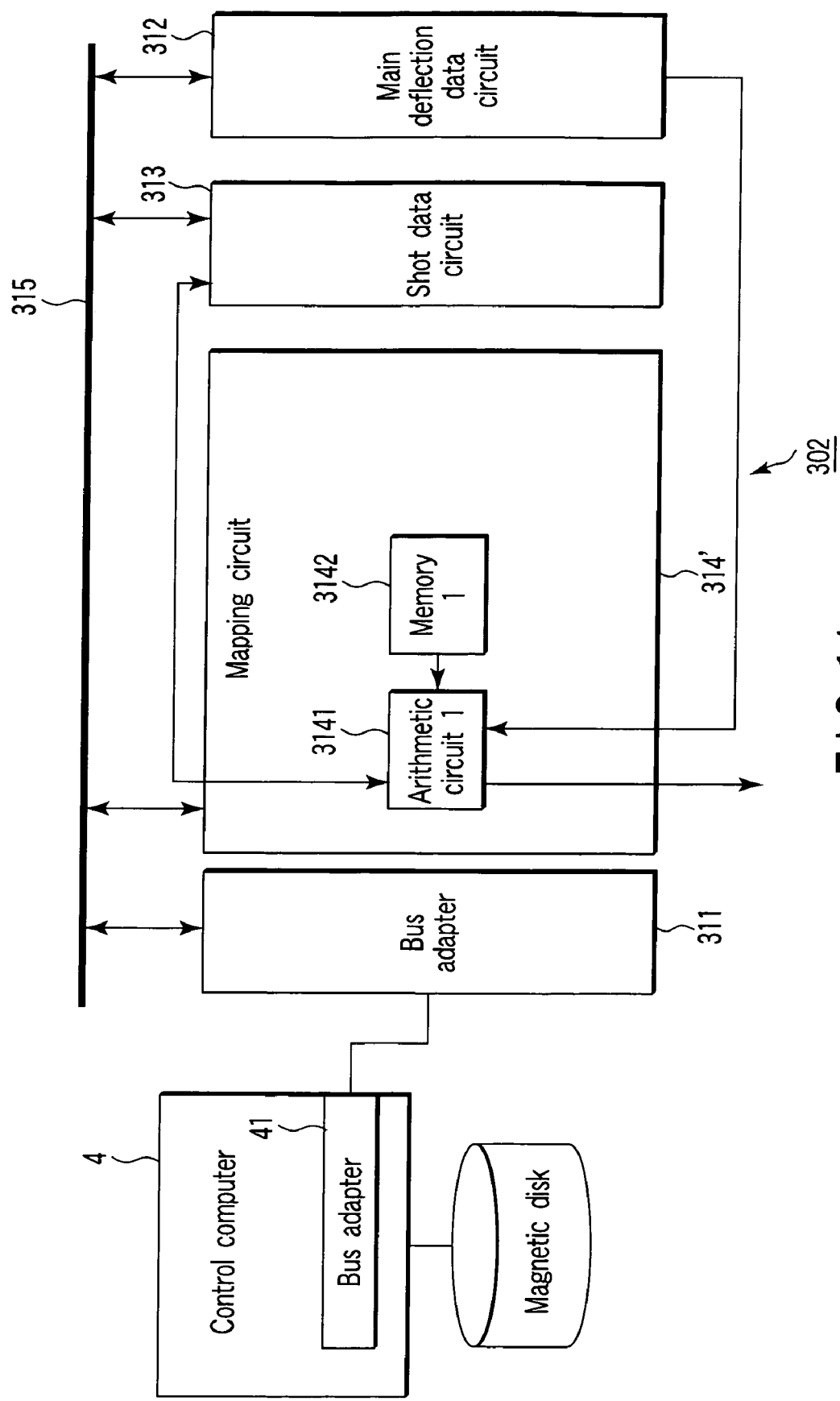
FIG. 14 is a block diagram showing the arrangement of a data mapping circuit according to a third embodiment.

FIG. 14 is a block diagram showing the arrangement of the data mapping circuit 302 according to the third embodiment. The data mapping circuit 302 comprises a bus adapter 311, main deflection data circuit 312, shot data circuit 313, and mapping circuit 314', which are connected to a data bus 315. The control computer 4 writes the chip data in the data mapping circuit 302 via a bus adapter 41. Main deflection data is stored in a memory in the main deflection data circuit 312, and shot data is stored in that in the shot data circuit 313. The procedure data shown in FIG. 8 is stored in a first memory 3142 connected to a first arithmetic circuit 3141 in the mapping circuit 314'.

Figure 15:
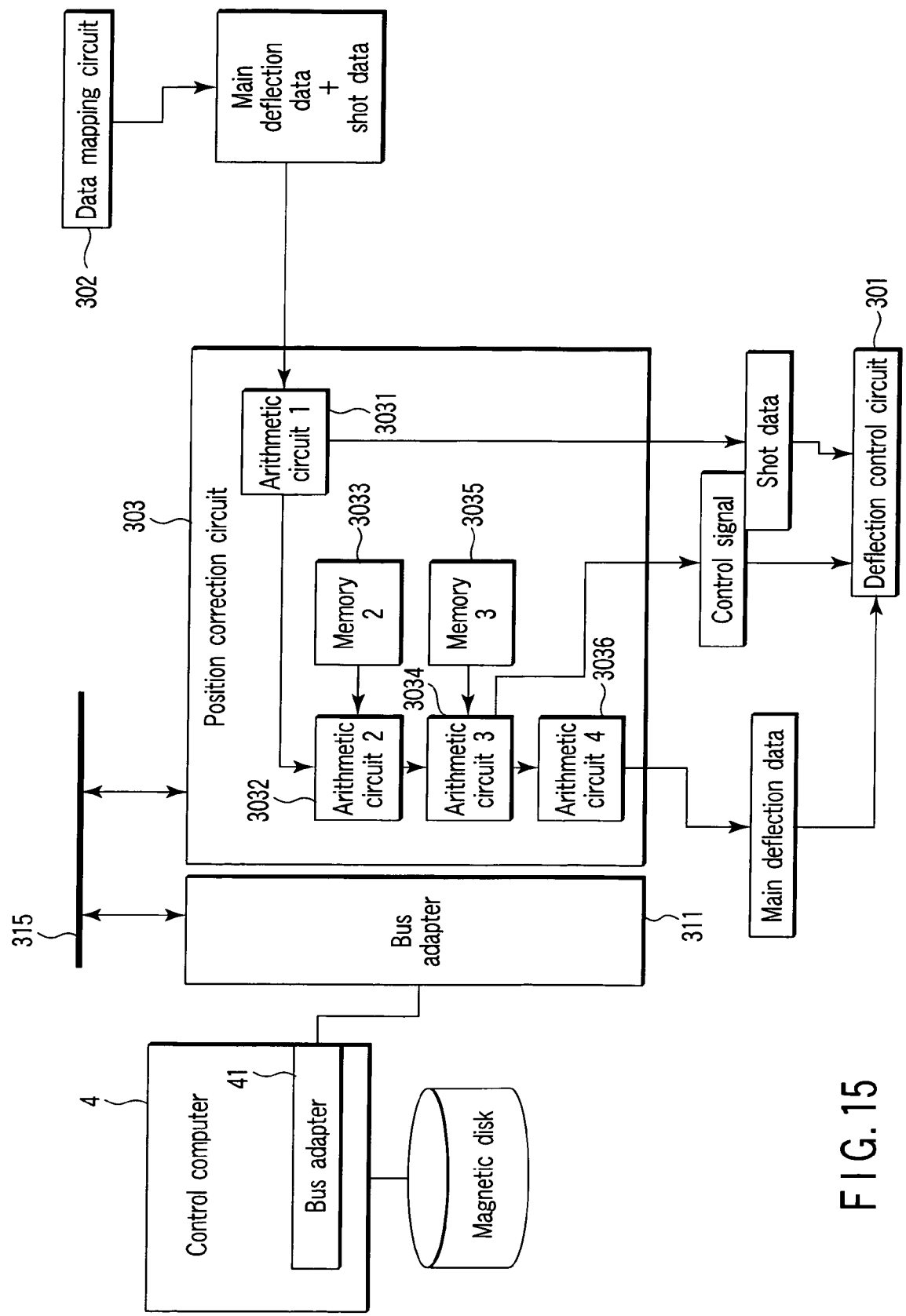
FIG. 15 is a block diagram showing the arrangement of a position correction circuit according to the third embodiment.

FIG. 15 is a block diagram showing the arrangement of the position correction circuit 303 according to the third embodiment. The control computer 4 writes the drawing data 401a in the data mapping circuit 302, and the wafer layout data 401b (including chip position data, frame position data, and stripe position data) and the wafer shape data 401c in the position correction circuit 303.

The chip position data shown in FIG. 5B, the frame position data shown in FIG. 6B, and the stripe position data shown in FIG. 7B are stored in a second memory 3033 connected to a second arithmetic circuit 3032 in the position correction circuit 303. The wafer shape data shown in FIG. 10 is stored in a third memory 3035 connected to a third arithmetic circuit 3034.

In FIG. 3, after the wafer S is placed on the stage 101 and a drawing preparation is completed, the control computer 4 issues a data output instruction to the data mapping circuit 302. The drawing preparation means a state in which a moving start point and end point of the stage 101 are calculated, and the stage 101 is located at the moving start point. The moving start point and end point of the stage 101 are calculated from a drawing start point and end point (Xstart, Xend) of each stripe. A runup distance and deceleration distance (X runup, X deceleration) are determined based on the drawing start point and end point (Xstart, Xend) of each stripe in correspondence with the stage speed of each stripe. That is, a stage moving start point and end point (Xstgs, Xstge) are determined as follows:

In case of forward movement, stage moving start point (*X*stgs)=drawing start point (*X*start)−runup distance (*X* runup)

stage moving end point (*X*stge)=drawing end point (*X*end)+deceleration distance (*X* deceleration)

In case of reverse movement, stage moving start point (*X*stgs)=drawing start point (*X*start)+runup distance (*X* runup)

stage moving end point (*X*stge)=drawing end point (*X*end)−deceleration distance (*X* deceleration)

More specifically, when the transfer start address, the number of words, and the number of transfer repetition times are instructed to the main deflection data circuit 312 shown in FIG. 14, transfer of the main deflection data starts from the memory in the main deflection data circuit 312 to the first arithmetic circuit 3141 in the mapping circuit 314'. The main deflection data circuit 312 determines to output data or pause data transfer by detecting a half-full (HF) flag of a FIFO in the mapping circuit 314'.

After the data output instruction is issued to the data mapping circuit 302, the control computer 4 issues a moving instruction to the stage 101. The control computer 4 moves the stage 101 to the stage moving start point via the stage driving circuit 11, and designates the moving end position and speed.

When the first arithmetic circuit 3141 in the mapping circuit 314' receives the main deflection data from the main deflection data circuit 312 by its FIFO, and loads one set of main deflection data from the FIFO, it reads out shot data from the shot data circuit 313. More specifically, the first arithmetic circuit 3141 activates the shot data circuit 313 by designating the start address of shot data and the number of shots included in the main deflection data shown in FIG. 4A. The shot data circuit 313 outputs shot data described at the address designated from the first arithmetic circuit 3141 as many as the designated number of shots.

The first arithmetic circuit 3141 appends the shot data sent from the shot data circuit 313 to the main deflection data, and outputs that data to the subsequent position correction circuit 303 in the format shown in FIG. 12. In this case, the first arithmetic circuit 3141 appends chip numbers, frame numbers, and stripe numbers to the main deflection data received from the main deflection data circuit 312 in accordance with the procedure data stored in the first memory 3142. The last sub deflection position data of each frame is appended with a control code indicating the end of the frame, and the first arithmetic circuit 3141 detects this control code to advance the procedure of the procedure data by one.

The position correction circuit 303 divides the received data into the main scan data and shot data. Initially, a first arithmetic circuit 3031 divides the received data into main deflection data and shot data. The main deflection data is output to the second arithmetic circuit 3032, and the shot data is output to the arithmetic unit 301c of the deflection control circuit 301.

The second arithmetic circuit 3032 of the position correction circuit 303 converts the main deflection data which are sent from the data mapping circuit 302 and includes the chip numbers and frame numbers onto the wafer coordinate system to determine whether or not the data fall within the valid range.

First, the second arithmetic circuit 3032 calls out chip position data stored in the second memory 3033 based on the chip number and reads out a chip position (Xchip, Ychip) described using the wafer coordinate system (the wafer center is an origin).

Next, the second arithmetic circuit 3032 calls out frame position data stored in the second memory 3033 based on the frame number, and reads out a frame origin position (Xf, Yf) described using the chip coordinate system (the chip center is an origin).

Then, the second arithmetic circuit 3032 adds the chip position (Xchip, Ychip), frame position (Xf, Yf), and main deflection position (Xm, Ym) to calculate a main deflection position (Xmwf, Ymwf) on the wafer coordinate system.

$Xmwf=Xm+Xf+Xchip$ $Ymwf=Ym+Yf+Ychip$

Note that the main deflection position (Xmwf, Ymwf) indicates the drawing position of each sub deflection region on the wafer coordinate system (from the wafer origin).

The third arithmetic circuit 3034 of the position correction circuit 303 determines if data is valid with respect to the main deflection position (Xmwf, Ymwf). The third arithmetic circuit 3034 calls out the wafer shape data shown in FIG. 10 from the third memory 3035, calls out the wafer valid range (Xmin, Xmax) from the third memory 3035 based on the main deflection position Ymwf, and compares the main deflection position Xmwf with the wafer valid range (Xmin, Xmax).

In this comparison, if the main deflection position Xmwf falls outside the valid range which is defined by:

wafer valid range Xmin<main deflection position Xmwf<wafer valid range Xmax the third arithmetic circuit 3034 sets a control flag that instructs the deflection control circuit 301 to forcibly turn off a beam. More specifically, a register as a control flag that instructs to turn off a beam is assured in the deflection control circuit 301, and the third arithmetic circuit 3034 sets the flag of this register. The deflection control circuit 301 controls to turn on or off a beam in correspondence with the shot data in the sub deflection region output from the position correction circuit 303 based on the control flag that instructs to turn off a beam. In this way, drawing is done in the deflection control circuit 301, but the sample S is not irradiated with any beam. On the other hand, if the main deflection position Xmwf falls within the valid range in the above comparison, the third arithmetic circuit 3034 sets a control flag that instructs the deflection control circuit 301 to perform normal drawing. In this case, drawing is done according to the drawing time period described in the shot data.

Furthermore, a fourth arithmetic circuit 3036 applies position correction of a wafer distortion and chip distortion to the main deflection data, converts the main deflection data from the wafer coordinate system into the stage coordinate system, and outputs the converted data to the subsequent deflection control circuit 301. Note that the fourth arithmetic circuit 3036 comprises a memory (not shown), which stores coefficients required for position correction.

The deflection control circuit 301 processes the received main deflection data and shot data. As for the main deflection data converted into the stage coordinate system, the arithmetic unit 301a determines a main deflection position (Xmdef, Ymdef) based on the output (current stage coordinates (Xstg, Ystg), wafer height) from the position circuit 12, and applies position correction due to a lens distortion. Note that the main deflection position (Xmdef, Ymdef) is the drawing position of the sub deflection region on a main deflection region coordinate system (from a main deflection region origin), and is obtained by adding a chip distortion correction amount and wafer distortion correction amount.

$Xmdef=Xmstg-Xstg$ $Ymdef=Ymstg-Ystg$

Furthermore, the main deflection data is output to the main deflection amplifier 403 via the arithmetic unit 301b, thus controlling the main deflector 206a to generate a desired voltage.

The arithmetic unit 301b always measures the output from the position circuit 12, and corrects the output from the main deflection amplifier 403 so that the electron beam position traces the stage position. The shot data undergoes a position correction arithmetic operation by the arithmetic unit 301c, and is then output to the sub deflection amplifier 404, thus controlling the sub deflector 206b to generate a desired voltage.

When the main deflector 206a and the sub deflector 206b have reached the desired voltages, a blanking signal generation circuit (not shown) releases a blanking signal, and the wafer S is irradiated with an electron beam b.

According to the third embodiment, since it is determined based on the wafer shape information if each deficient chip part is located on the wafer, and beam irradiation is done based on the determination result, the chip yield can be improved. Also, no contaminations are generated. Furthermore, no drawing data is prepared for deficient chip drawing, and the wasteful time can be reduced. Therefore, the productivity in electron beam exposure can be greatly improved.

The fourth embodiment will be described below.

The schematic views of the electron beam lithography apparatus according to the fourth embodiment are the same as those shown in FIGS. 1 and 3 in the first embodiment, and the data mapping circuit is the same as that shown in FIG. 14 in the third embodiment. A description redundant to that of the electron beam lithography apparatus of the first to third embodiments will be omitted.

Figure 16:
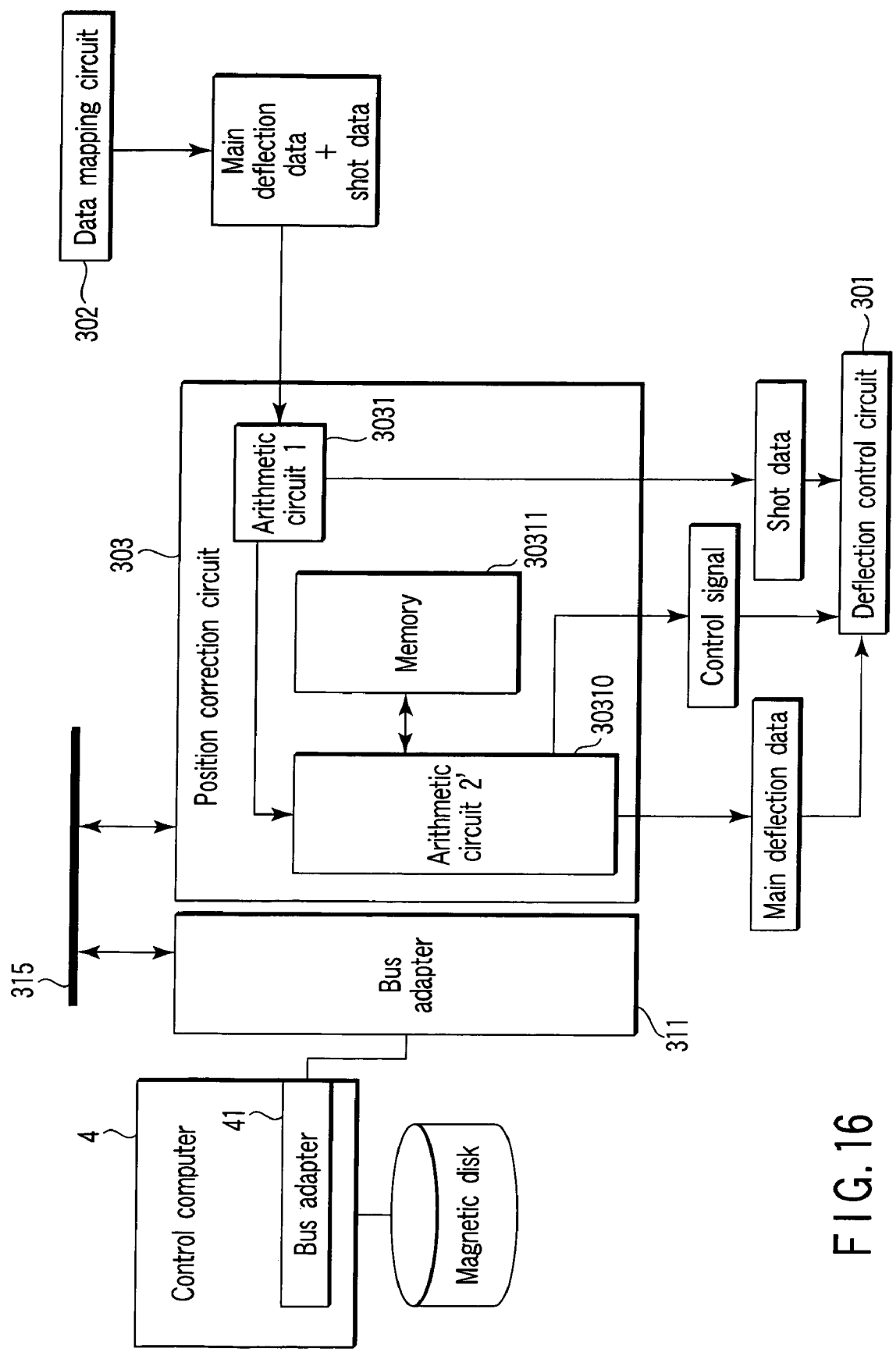
FIG. 16 is a block diagram showing the arrangement of a position correction circuit according to a fourth embodiment.

FIG. 16 is a block diagram showing the arrangement of the position correction circuit 303 according to the fourth embodiment. A difference of the fourth embodiment from the third embodiment is that the second to fourth arithmetic circuits (3032, 3034, and 3036) in the third embodiment are configured using a DSP (Digital Signal Processor). Accordingly, the second and third memories (3033 and 3035) are replaced by an internal or external memory (second memory 30311 in FIG. 16) connected to the DSP via a bus.

In the fourth embodiment, after it is determined whether or not data is valid with respect to the main deflection position (Xmwf, Ymwf), position correction of a wafer distortion and chip distortion is applied. However, the order of these processes may be reversed. A description of the fourth embodiment of the invention will be given according to the processing flow which applies position correction of a wafer distortion and chip distortion to the main deflection position (Xmwf, Ymwf) and then determines whether or not data is valid.

The control computer 4 shown in FIG. 16 writes the drawing data 401a in the data mapping circuit 302, and the wafer layout data 401b (including chip position data, frame position data, and stripe position data) and the wafer shape data 401c in the position correction circuit 303.

As in the third embodiment, after the data output instruction is issued to the data mapping circuit 302, the control computer 4 issues a moving instruction to the stage 101. The control computer 4 moves the stage 101 to the stage moving start point via the stage driving circuit 11, and designates the moving end position and speed.

When the first arithmetic circuit 3141 in the mapping circuit 314' receives the main deflection data from the main deflection data circuit 312 by its FIFO, and loads one set of main deflection data from the FIFO, it reads out shot data from the shot data circuit 313. More specifically, the first arithmetic circuit 3141 activates the shot data circuit 313 by designating the start address of shot data and the number of shots included in the main deflection data shown in FIG. 4A. The shot data circuit 313 outputs shot data described at the address designated from the first arithmetic circuit 3141 as many as the designated number of shots.

The first arithmetic circuit 3141 appends the shot data sent from the shot data circuit 313 to the main deflection data, and outputs that data to the subsequent position correction circuit 303 in the format shown in FIG. 12. In this case, the first arithmetic circuit 3141 appends chip numbers, frame numbers, and stripe numbers to the main deflection data received from the main deflection data circuit 312 in accordance with the procedure data stored in the first memory 3142. The last sub deflection position data of each frame is appended with a control code indicating the end of the frame, and the first arithmetic circuit 3141 detects this control code to advance the procedure of the procedure data by one.

The position correction circuit 303 divides the received data into the main scan data and shot data. Initially, a first arithmetic circuit 3031 divides the received data into main deflection data and shot data. The main deflection data is output to a second arithmetic circuit 30310, and the shot data is output to the arithmetic unit 301c of the deflection control circuit 301.

The second arithmetic circuit 30310 of the position correction circuit 303 converts the main deflection data which is received from the data mapping circuit 302 and includes the chip numbers and frame numbers into the wafer coordinate system, and determines whether or not to fall within the valid range. Note that the second arithmetic circuit comprises a DSP (Digital Signal Processor), and it will be referred to as a DSP hereinafter. In the DSP 30310, an execution program is sent from the control computer 4, and is written in an internal memory of the DSP 30310 and a second memory 30311 connected to the DSP 30310 via the bus adapter 311 and data bus 315. When the position correction circuit includes a ROM (Read Only Memory) connected to the DSP 30310, the execution program may be loaded from that ROM.

Figure 17:
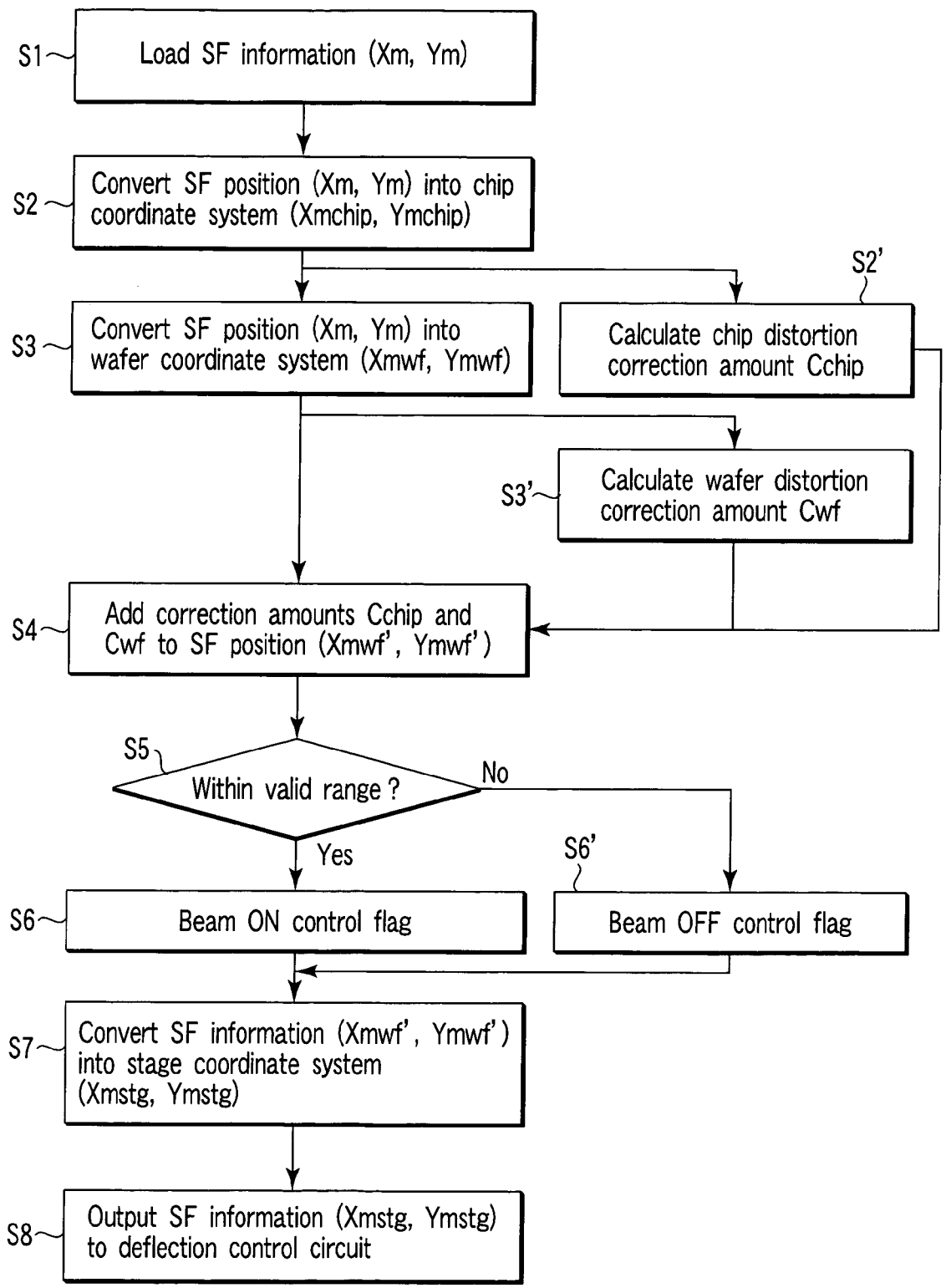
FIG. 17 is a flowchart showing the processing of an arithmetic circuit according to the fourth embodiment.

FIG. 17 shows the processing flow (S1 to S7) in the DSP 30310.

Step S1) The DSP 30310 reads out main deflection data (SF information in FIG. 17) which is output from the first arithmetic circuit 3031 and includes the chip numbers, frame numbers, and the like.

Step S2) The DSP 30310 calls out frame position data stored in the second memory 30311 based on the frame number assigned to the main deflection data (SF information in FIG. 17), and reads out a frame origin position (Xf, Yf) described using the chip coordinate system (the chip center is an origin). Furthermore, the DSP 30310 adds the frame position (Xf, Yf) and main deflection position (Xm, Ym) to calculate a main deflection position (Xmchip, Ymchip) on the chip coordinate system. Note that the main deflection position (Xmchip, Ymchip) indicates the drawing position of the sub deflection region on the chip coordinate system (from the chip origin).

$Xm\text{chip}=Xm+Xf$ $Ym\text{chip}=Ym+Yf$

Step S2') The DSP 30310 calculates chip distortion correction amounts for the main deflection position (Xmchip, Ymchip) on the chip coordinate system. Chip distortion coefficients are stored in advance in the second memory 30311 in correspondence with chip numbers as ternary coefficients for Xmchip and Ymchip. The DSP 30310 calls out chip distortion coefficients based on the chip number assigned to the main deflection data (SF information in FIG. 17), and calculates chip distortion correction amounts Cchipx and Cchipy for the main deflection position (Xmchip, Ymchip).

Step S3) The DSP 30310 then calls out chip position data stored in the second memory 30311 based on the chip number assigned to the main deflection data (SF information in FIG. 17), and reads out a chip position (Xchip, Ychip) described using the wafer coordinate system (the wafer center is an origin). Furthermore, the DSP 30310 calculates a main deflection position (Xmwf, Ymwf) on the wafer coordinate system based on the main deflection position (Xmchip, Ymchip) on the chip coordinate system. Note that the main deflection position (Xmwf, Ymwf) indicates the drawing position of each sub deflection region on the wafer coordinate system (from the wafer origin).

$Xmwf=Xm\text{chip}+X\text{chip}$ $Ymwf=Ym\text{chip}+Y\text{chip}$

Step S3') The DSP 30310 calculates wafer distortion correction amounts for the main deflection position (Xmwf, Ymwf) on the wafer coordinate system. Wafer distortion coefficients are stored in advance in the second memory 30311 as ternary coefficients for Xmwf and Ymwf. The DSP 30310 calls out wafer distortion coefficients, and calculates wafer distortion correction amounts Cwfx and Cwfy for the main deflection position (Xmwf, Ymwf).

Step S4) Furthermore, the DSP 30310 applies position correction of a wafer distortion and chip distortion to the main deflection data. In this case, the chip distortion correction amounts Cchipx and Cchipy and the wafer distortion correction amounts Cwfx and Cwfy are added to the main deflection position (Xmwf, Ymwf) on the wafer coordinate system to calculate a main deflection position (Xmwf', Ymwf') on the wafer coordinate system. Note that the main deflection position (Xmwf', Ymwf') is the drawing position of the sub deflection region on the wafer coordinate system (from the wafer origin), and is obtained by adding the chip distortion correction amounts and wafer distortion correction amounts.

$$Xmwf'=Xmwf+Cchipx+Cwfx$$

$$Ymwf'=Ymwf+Cchipy+Cwfy$$

Step S5) The DSP 30310 determines whether or not data is valid with respect to the main deflection position (Xmwf', Ymwf'). The DSP 30310 calls out the wafer shape data shown in FIG. 10 from the second memory 30311, calls out the wafer valid range (Xmin, Xmax) from the second memory 30311 based on the main deflection position Ymwf', and compares the main deflection position Xmwf' with the wafer valid range (Xmin, Xmax).

Step S6') In this comparison, if the main deflection position Xmwf' falls outside the valid range which is defined by:

wafer valid range Xmin<main deflection position Xmwf'<wafer valid range Xmax the DSP 30310 sets a control flag that instructs the deflection control circuit 301 to forcibly turn off a beam. In this way, drawing is done in the deflection control circuit 301, but the sample S is not irradiated with any beam.

Step S6) On the other hand, if the main deflection position Xmwf' falls within the valid range in the comparison in step S5, the DSP 30310 sets a control flag that instructs the deflection control circuit 301 to perform normal drawing. In this case, drawing is done according to the drawing time period described in the shot data.

Step S7) The DSP 30310 adds a wafer origin (Xwf, Ywf) described using the stage coordinate system to the main deflection position (Xmwf', Ymwf') described using the wafer coordinate system to calculate a main deflection position (Xmstg, Ymstg) converted into the stage coordinate system. Note that the main deflection position (Xmstg, Ymstg) is the drawing position of the sub deflection region on the stage coordinate system (from the stage origin), and is obtained by adding the chip distortion correction amounts and wafer distortion correction amounts.

$$Xmstg=Xmwf'+Xwf$$

$$Ymstg=Ymwf'+Ywf$$

Step S8) Finally, the DSP 30310 outputs the calculated main deflection position (Xmstg, Ymstg) to the subsequent deflection control circuit 301.

The deflection control circuit 301 processes the received main deflection data and shot data. As for the main deflection data converted into the stage coordinate system, the arithmetic unit 301a determines a main deflection position (Xmdef, Ymdef) based on the output (current stage coordinates (Xstg, Ystg), wafer height) from the position circuit 12, and applies position correction due to a lens distortion. Note that the main deflection position (Xmdef, Ymdef) is the drawing position of the sub deflection region on a main deflection region coordinate system (from a main deflection region origin), and is obtained by adding the chip distortion correction amounts and wafer distortion correction amounts.

$$Xmdef=Xmstg-Xstg$$

$$Ymdef=Ymstg-Ystg$$

Furthermore, the main deflection data is output to the main deflection amplifier 403 via the arithmetic unit 301b, thus controlling the main deflector 206a to generate a desired voltage.

The arithmetic unit 301b always measures the output from the position circuit 12, and corrects the output from the main deflection amplifier 403 so that the electron beam position traces the stage position. The shot data undergoes a position correction arithmetic operation by the arithmetic unit 301c, and is then output to the sub deflection amplifier 404, thus controlling the sub deflector 206b to generate a desired voltage.

When the main deflector 206a and the sub deflector 206b have reached the desired voltages, a blanking signal generation circuit (not shown) releases a blanking signal, and the wafer S is irradiated with an electron beam b.

Figure 18:
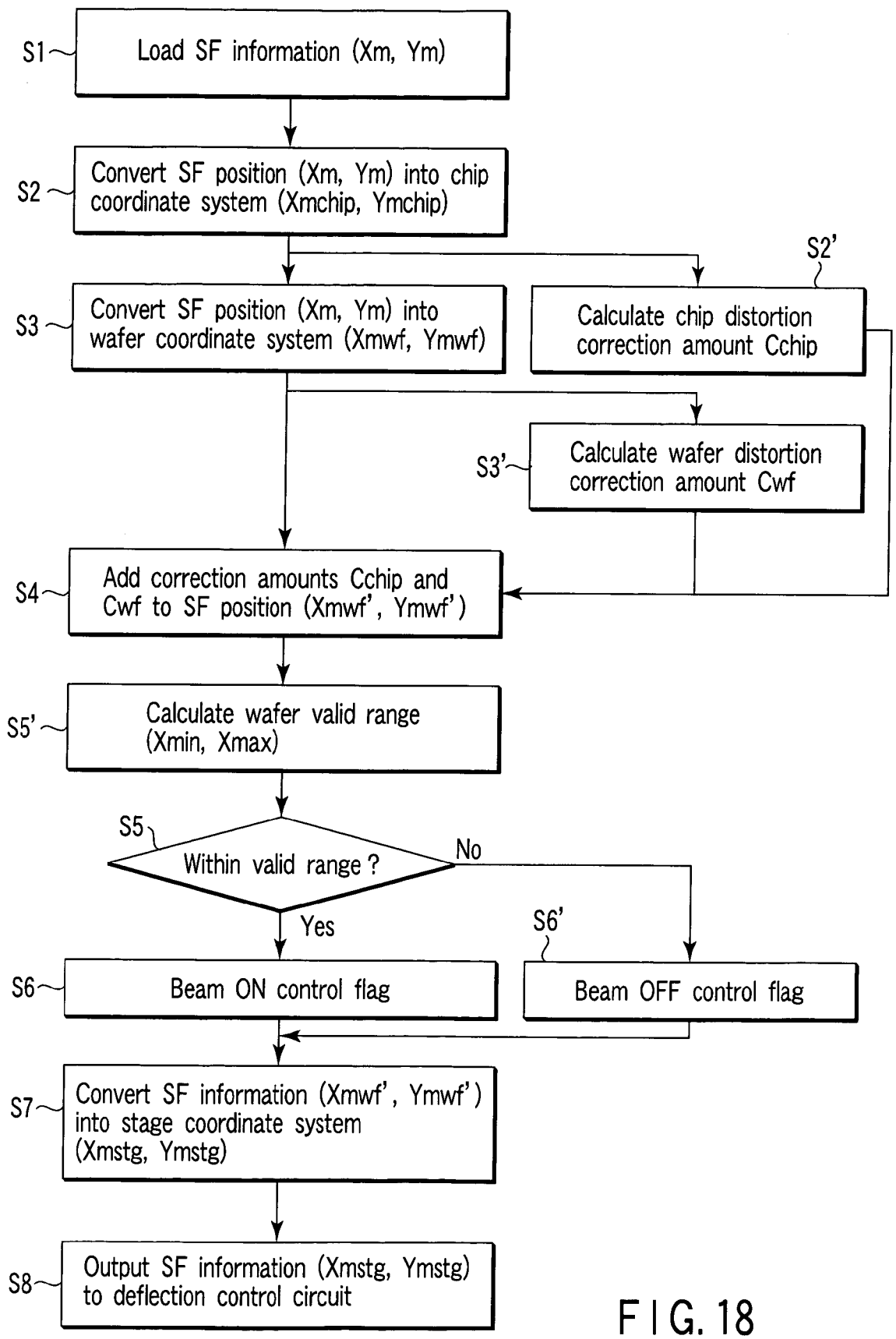
FIG. 18 is a flowchart showing another processing of the arithmetic circuit according to the fourth embodiment.
Figure 19:
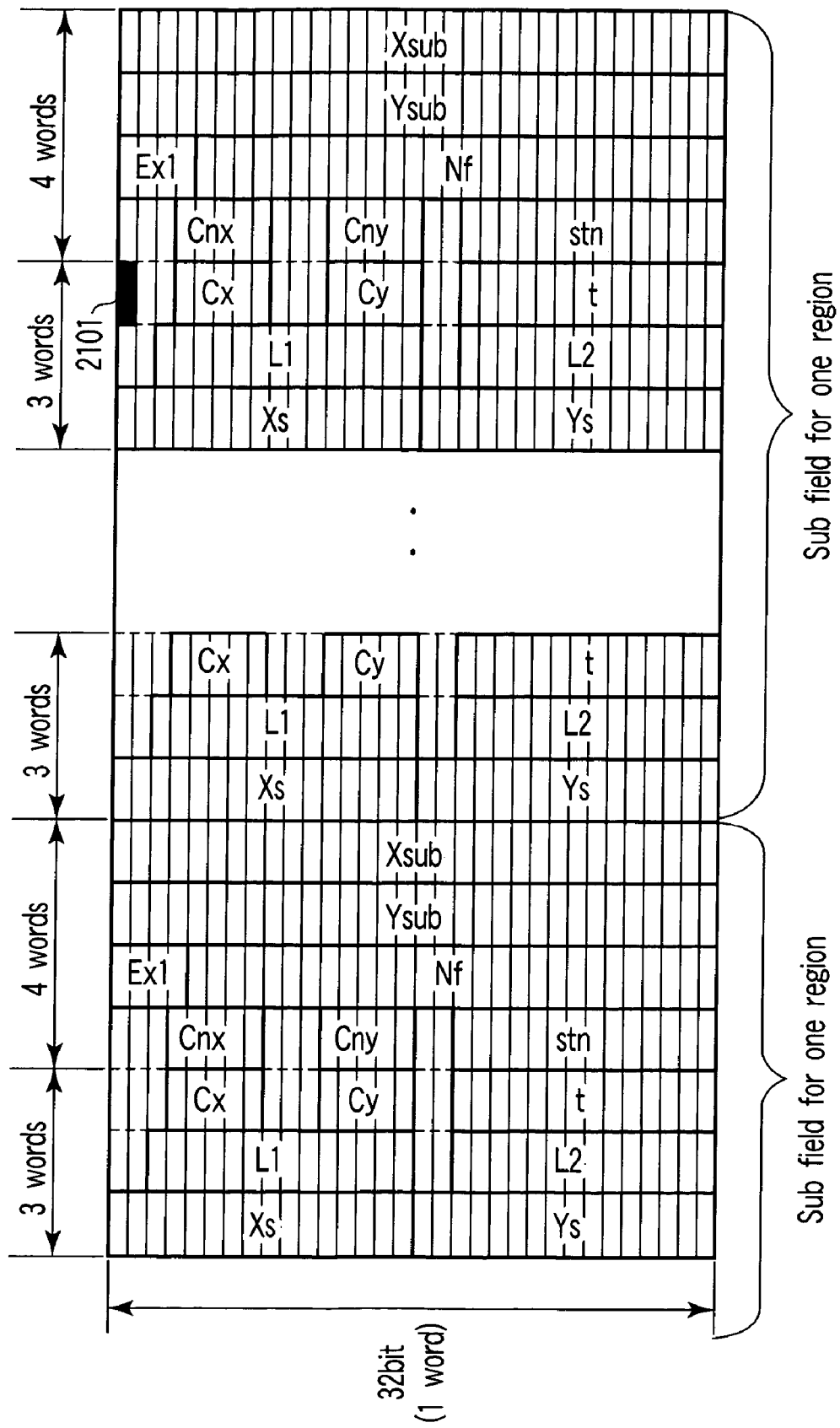
FIG. 19 is a view for explaining the output data format of the position correction circuit in the third and fourth embodiments.

In the description of the above embodiment, the control computer 4 generates the wafer shape data 401c based on the wafer layout data 401b (including procedure data, chip position data, frame position data, and stripe position data) and the wafer valid range (broken line, a in FIG. 9), and writes it in the data mapping circuit 302. However, another method may be used. For example, the control computer 4 may write the wafer valid range in the position correction circuit 303, which may generate the wafer shape data shown in FIG. 10. For example, as shown in FIG. 19, a value (e.g., 95 mm (radius)) indicating the wafer valid range is written in advance in the DSP 30310, and the valid range (Xmin, Xmax) for each stripe can be calculated based on the main deflection position Xmwf' (S5' in FIG. 18). Also, the value (e.g., 95 mm (radius)) indicating the wafer valid range is written in advance in the DSP 30310, and the DSP 30310 can generate the wafer shape data shown in FIG. 10 in advance.

In the third and fourth embodiments, a register as a control flag that instructs to turn off a beam is assured in the deflection control circuit 301, and the deflection control circuit 301 controls to turn on or off a beam in correspondence with the shot data in the sub deflection region output from the position correction circuit 303 based on the control flag that instructs to turn off a beam. However, another method may be used.

For example, a control flag that instructs to turn off a beam may be set in an empty bit of the drawing data shown in FIG. 12. More specifically, as shown in FIG. 19, an empty bit (2101) in the shot data is used as a control flag that instructs to turn off a beam, and the deflection control circuit 301 may read this bit (2101) to control to turn on or off a beam in correspondence with the shot data in the sub deflection region.

According to this modification, since it is determined based on the wafer shape information if each deficient chip part is located on the wafer, and beam irradiation is done based on the determination result, the chip yield can be improved. Also, no contaminations are generated. Furthermore, no drawing data is prepared for deficient chip drawing, and the wasteful time can be reduced. Therefore, the productivity in electron beam exposure can be greatly improved.

In the fifth embodiment, a stage runup position and drawing range are calculated based on wafer shape data unlike in the first to fourth embodiments.

The schematic views of the electron beam lithography apparatus according to the fifth embodiment are the same as those shown in FIGS. 1 and 3 in the first embodiment.

In the fifth embodiment, the moving start point and end point (Xstgs, Xstge) of the stage 101 are calculated using the wafer shape data shown in FIG. 10. Initially, a drawing start point and end point (Xstart, Xend) of each stripe are calculated from the chip layout. The drawing start point and end point (Xstart, Xend) of each stripe are compared with the wafer valid range (Xmin, Xmax) described in the wafer shape data. If the drawing start point and end point (Xstart, Xend) are broader than the wafer valid range (Xmin, Xmax), the wafer valid range (Xmin, Xmax) is replaced by the drawing start point and end point. Upon completion of updating of the drawing start point and end point (Xstart, Xend) of each stripe, a runup distance and deceleration distance (X runup, X deceleration) are determined in correspondence with the stage speed of each stripe. That is, the stage moving start point and end point (Xstgs, Xstge) are determined as follows:

In case of forward movement, stage moving start point ($Xstgs$)=drawing start point ($X$start)−runup distance ($X$ runup)

stage moving end point ($Xstge$)=drawing end point ($X$end)+deceleration distance ($X$ deceleration)

In case of reverse movement, stage moving start point ($Xstgs$)=drawing start point ($X$start)+runup distance ($X$ runup)

stage moving end point ($Xstge$)=drawing end point ($X$end)−deceleration distance ($X$ deceleration)

Subsequently, based on the chip number in the procedure data shown in FIG. 8, a chip position range (Xmin, Xmax) of that procedure is calculated. The chip position range (Xmin, Xmax) of that procedure is compared with the drawing start point and end point (Xstart, Xend) of the corresponding stripe. If the chip completely falls outside the range of the drawing start point and end point (Xstart, Xend) of the corresponding stripe, that procedure is deleted.

This processing is applied to all the procedures to update the procedure data.

Figure 20:
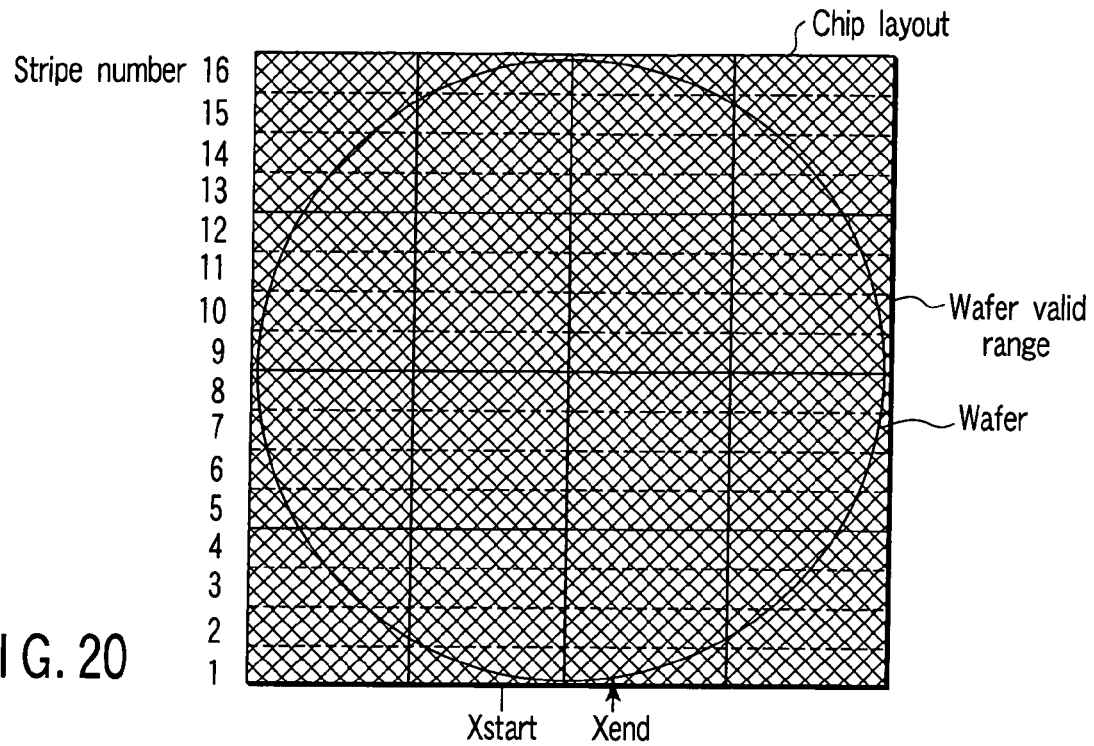
FIG. 20 is a view for explaining a drawing range based on a conventional method.
Figure 21:
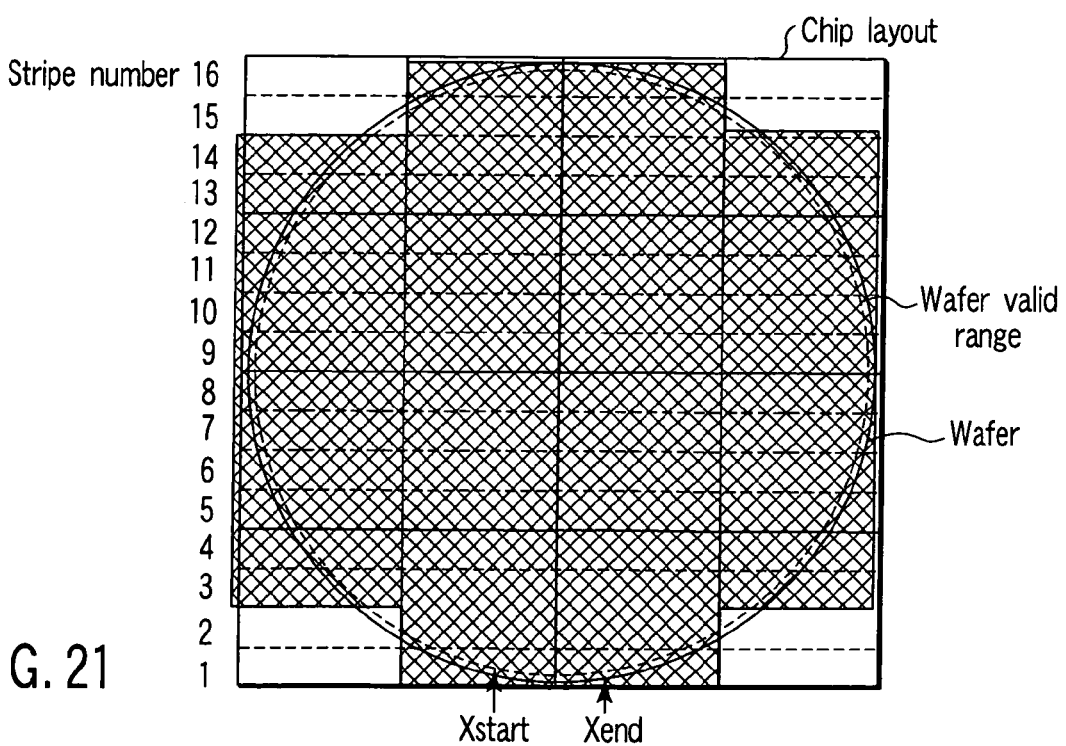
FIG. 21 is a view for explaining a drawing range indicated by procedure data generated according to the fifth embodiment.

FIG. 20 is a view for explaining the drawing range based on the conventional method. FIG. 21 is a view for explaining the drawing range indicated by the procedure data generated according to the fifth embodiment. As can be seen from FIG. 21, the drawing area of the drawing range shown in FIG. 21 is smaller than that based on the conventional method shown in FIG. 20. Upon drawing, the procedure data generated in this way is transferred to the electron beam lithography apparatus of each of the first to fourth embodiments to execute drawing.

According to the fifth embodiment, since it is determined based on the wafer shape information if each deficient chip part is located on the wafer, and beam irradiation is done based on the determination result, the chip yield can be improved. Also, no contaminations are generated on the stage. Furthermore, no drawing data is prepared for deficient chip drawing, and the wasteful time can be reduced. Furthermore, the wasteful time associated with stage movement can be reduced. Therefore, the productivity in electron beam exposure can be greatly improved.

Finally, a semiconductor device is manufactured by using the wafer on which the electron beam lithography process described in any of the first to fifth embodiments is performed.

Note that the invention is not limited to the above embodiments, and modifications may be made as needed without departing from the scope of the invention. For example, in each of the above embodiments, the operator designates the wafer valid range (broken line, a in FIG. 9), and inputs it to the control computer. Alternatively, the wafer valid range may be designated by another method. For example, a valid range may be registered in advance in the computer as a system parameter. When the electron beam lithography apparatus is controlled by a production control computer, the production control computer may generate the drawing data 401a, wafer layout data 401b, and wafer shape data 401c and may store them in the computer 4.

According to the embodiments of the invention, an electron beam lithography apparatus, lithography method, and lithography program which efficiently make deficient chip drawing, and a manufacturing method of a semiconductor device can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam lithography apparatus comprising:
a first setting unit configured to set a drawing position on a semiconductor substrate based on layout information of the semiconductor substrate;
a second setting unit configured to set a valid range on the semiconductor substrate based on shape information of the semiconductor substrate;
a determination unit configured to determine whether or not the drawing position falls within the valid range; and
an irradiation unit configured to irradiate the semiconductor substrate with an electron beam when the determination unit determines that the drawing position falls within the valid range.

2. The apparatus according to claim 1, wherein the layout information includes information of chip positions, frame positions, and stripe positions.

3. The apparatus according to claim 2, wherein the first setting unit adds the chip position, the frame position, and a main-deflection position to calculate the drawing position.

4. The apparatus according to claim 1, which further comprises:
a correction unit configured to correct an irradiation position by the irradiation unit.

5. The apparatus according to claim 4, wherein the determination unit appends a control flag that instructs to turn off a beam to the correction unit when it is determined that the drawing position falls outside the valid range.

6. The apparatus according to claim 4, wherein the correction unit and the determination unit are included in one circuit.

7. The apparatus according to claim 1, wherein the drawing position set by the first setting unit is a drawing position in a sub deflection region.

8. The apparatus according to claim 1, wherein the shape information of the semiconductor substrate is generated based on intersections between a valid range of the semiconductor substrate in a chip layout on the semiconductor substrate and positions of the respective stripes in one axis direction.

9. The apparatus according to claim 1, wherein the first setting unit, the second setting unit, and the determination unit are configured using a DSP.

10. An electron beam lithography method comprising:
setting a drawing position on a semiconductor substrate based on layout information of the semiconductor substrate;
setting a valid range on the semiconductor substrate based on shape information of the semiconductor substrate;
determining whether or not the drawing position falls within the valid range; and irradiating the semiconductor substrate with an electron beam when it is determined that the drawing position falls within the valid range.

11. The method according to claim 10, wherein the layout information includes information of chip positions, frame positions, and stripe positions.

12. The method according to claim 11, wherein the set drawing position is calculated by adding the chip position, the frame position, and a main deflection position.

13. The method according to claim 10, which further comprises:
    correcting an irradiation position of the electron beam.

14. The method according to claim 13, which further comprises:
    outputting an instruction to turn off a beam when it is determined that the drawing position falls outside the valid range.

15. The method according to claim 10, wherein the set drawing position is a drawing position in a sub deflection region.

16. The method according to claim 10, wherein the shape information of the semiconductor substrate is generated based on intersections between a valid range of the semiconductor substrate in a chip layout on the semiconductor substrate and positions of the respective stripes in one axis direction.

17. An electron beam lithography program which is stored in a storage medium readable by a computer, the program making the computer:
    set a drawing position on a semiconductor substrate based on layout information of the semiconductor substrate;
    set a valid range on the semiconductor substrate based on shape information of the semiconductor substrate;
    determine whether or not the drawing position falls within the valid range; and
    irradiate the semiconductor substrate with an electron beam when it is determined that the drawing position falls within the valid range.

18. A manufacturing method of a semiconductor device which manufactures a semiconductor device by use of a semiconductor substrate on which a lithography process is performed, the lithography process comprising:
    setting a drawing position on a semiconductor substrate based on layout information of the semiconductor substrate;
    setting a valid range on the semiconductor substrate based on shape information of the semiconductor substrate;
    determining whether or not the drawing position falls within the valid range; and
    irradiating the semiconductor substrate with an electron beam when it is determined that the drawing position falls within the valid range.

19. The method according to claim 18, wherein the layout information includes information of chip positions, frame positions, and stripe positions.

20. The method according to claim 18, wherein the shape information of the semiconductor substrate is generated based on intersections between a valid range of the semiconductor substrate in a chip layout on the semiconductor substrate and positions of the respective stripes in one axis direction.

* * * * *